US012719449B2

(12) United States Patent
Bergmann

(10) Patent No.: US 12,719,449 B2
(45) Date of Patent: Aug. 25, 2026

(54) DOUBLE-MODE SURFACE-ACOUSTIC-WAVE (DMS) FILTER HAVING A MODULATED INTERDIGITAL TRANSDUCER

(71) Applicant: RF360 Singapore Pte. Ltd., Republic Plaza (SG)

(72) Inventor: Andreas Bergmann, Haiming (DE)

(73) Assignee: RF360 Singapore Pte. Ltd., Singapore (SG)

( * ) Notice: Subject to any disclaimer, the term of this patent is extended or adjusted under 35 U.S.C. 154(b) by 153 days.

(21) Appl. No.: 18/611,060

(22) Filed: Mar. 20, 2024

(65) Prior Publication Data

US 2025/0300632 A1 Sep. 25, 2025

(51) Int. Cl.
*H03H 9/64* (2006.01)
*H03H 9/02* (2006.01)

(52) U.S. Cl.
CPC ...... *H03H 9/6436* (2013.01); *H03H 9/02992* (2013.01)

(58) Field of Classification Search
CPC .. H03H 9/6436; H03H 9/02992; H03H 9/725; H03H 9/6426; H03H 9/6469; H03H 9/14555
USPC .................................................. 333/193–196
See application file for complete search history.

(56) References Cited

U.S. PATENT DOCUMENTS

| | | | | |
|---|---|---|---|---|
| 5,952,765 | A * | 9/1999 | Garber ................. | H03H 9/6433 333/195 |
| 6,329,888 | B1 | 12/2001 | Hirota | |
| 7,425,878 | B2 | 9/2008 | Inoue et al. | |
| 2002/0171329 | A1* | 11/2002 | Jian .................... | H03H 9/14505 310/313 R |
| 2005/0001696 | A1* | 1/2005 | Otsuka ............... | H03H 9/14588 333/195 |
| 2019/0036554 | A1 | 1/2019 | Ito et al. | |
| 2024/0204747 | A1 | 6/2024 | Binninger et al. | |
| 2025/0096772 | A1 | 3/2025 | Aigner et al. | |

OTHER PUBLICATIONS

International Search Report and Written Opinion—PCT/SG2025/050109—ISA/EPO—Jun. 24, 2025.

* cited by examiner

*Primary Examiner* — Jorge L Salazar, Jr.
(74) *Attorney, Agent, or Firm* — Polsinelli

(57) ABSTRACT

An apparatus is disclosed for a double-mode surface-acoustic-wave (SAW) filter having a modulated interdigital transducer. In example aspects, the apparatus includes a double-mode surface-acoustic-wave filter that has at least one interdigital transducer. The interdigital transducer includes a first busbar, a second busbar, and multiple fingers extending from the first busbar toward the second busbar. The multiple fingers include a first set of fingers having a first spatial property. The multiple fingers also include a second set of fingers having a second spatial property different from the first spatial property. The second spatial property includes at least two fingers of the second set of fingers being positioned adjacent to each other.

20 Claims, 17 Drawing Sheets

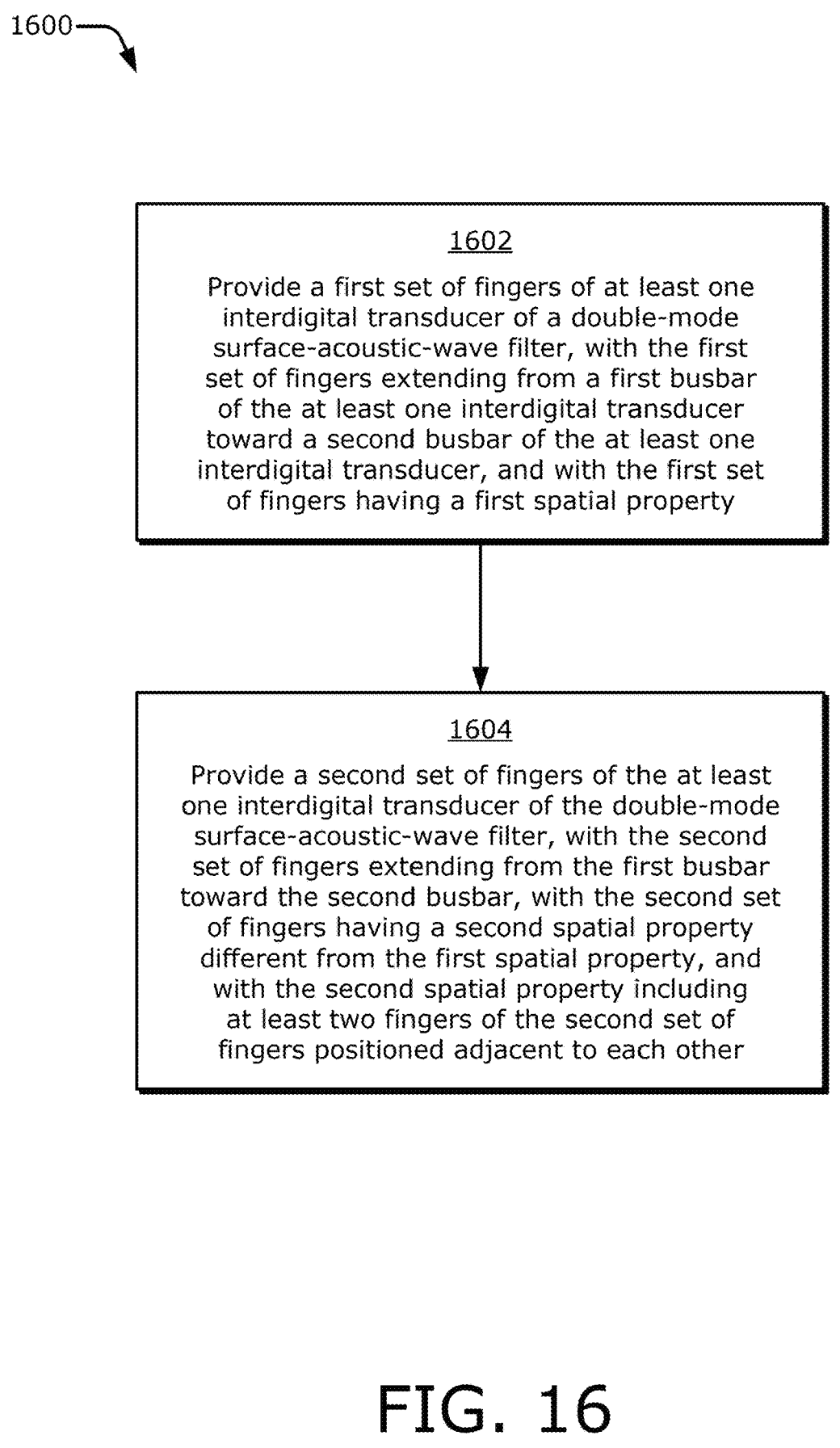

1600

1602

Provide a first set of fingers of at least one interdigital transducer of a double-mode surface-acoustic-wave filter, with the first set of fingers extending from a first busbar of the at least one interdigital transducer toward a second busbar of the at least one interdigital transducer, and with the first set of fingers having a first spatial property

1604

Provide a second set of fingers of the at least one interdigital transducer of the double-mode surface-acoustic-wave filter, with the second set of fingers extending from the first busbar toward the second busbar, with the second set of fingers having a second spatial property different from the first spatial property, and with the second spatial property including at least two fingers of the second set of fingers positioned adjacent to each other

FIG. 16

DOUBLE-MODE SURFACE-ACOUSTIC-WAVE (DMS) FILTER HAVING A MODULATED INTERDIGITAL TRANSDUCER

TECHNICAL FIELD

This disclosure relates generally to wireless transceivers and other components that employ filters and, more specifically, to implementing a double-mode surface-acoustic-wave (DMS) filter that has multiple sets of fingers that are modulated differently.

BACKGROUND

Electronic devices use radio-frequency (RF) signals to communicate information. These radio-frequency signals enable users to talk with friends, download information, share pictures, remotely control household devices, and receive global positioning information, just to name a few consumer-oriented examples. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for radio-frequency applications, including those that utilize frequencies above 100 megahertz (MHz).

SUMMARY

An apparatus is disclosed that implements a double-mode surface-acoustic-wave (DMS) filter that has multiple sets of fingers that are modulated differently. Each set of fingers can be part of a different region, with at least one region having modulated fingers. For example, respective transition regions of a double-mode surface-acoustic-wave filter can include sets of fingers respectively positioned at adjacent outer edges of two respective interdigital transducers. Each respective set of fingers can have a different spatial property. Within a given interdigital transducer, two sets of fingers can also have different spatial properties. Examples of such spatial properties that can be different include pitch, metallization ratio, quantity of fingers per cell, cell width, and whether a particular busbar has adjacent fingers with no intervening finger from an opposite busbar. The respective spatial property across at least a portion of each respective set of fingers may be substantially uniform. In some implementations, these spatial properties can be adjusted to modulate fingers differently within at least one interdigital transducer to change filter characteristics. For instance, a double-mode surface-acoustic-wave filter can be constructed to have at least one steeper skirt of the frequency response of the filter by modulating fingers as described herein. The steeper skirt enables an adjacent frequency band to be closer without causing interference.

In an example aspect, an apparatus for filtering is disclosed. The apparatus includes a double-mode surface-acoustic-wave filter, which includes at least one interdigital transducer. The at least one interdigital transducer includes a first busbar, a second busbar, and multiple fingers extending from the first busbar toward the second busbar. The multiple fingers include a first set of fingers having a first spatial property. The multiple fingers also include a second set of fingers having a second spatial property different from the first spatial property. The second spatial property includes at least two fingers of the second set of fingers positioned adjacent to each other.

In an example aspect, a method for manufacturing a double-mode surface-acoustic-wave filter is disclosed. The method includes providing a first set of fingers of at least one interdigital transducer of the double-mode surface-acoustic-wave filter. The first set of fingers extends from a first busbar of the at least one interdigital transducer toward a second busbar of the at least one interdigital transducer, with the first set of fingers having a first spatial property. The method also includes providing a second set of fingers of the at least one interdigital transducer of the double-mode surface-acoustic-wave filter. The second set of fingers extends from the first busbar toward the second busbar, with the second set of fingers having a second spatial property different from the first spatial property. The second spatial property includes at least two fingers of the second set of fingers positioned adjacent to each other.

In an example aspect, an apparatus for filtering is disclosed. The apparatus includes a double-mode surface-acoustic-wave filter, which includes at least one interdigital transducer. The at least one interdigital transducer includes a first region having multiple fingers arranged to alternate fingers from different busbars of the at least one interdigital transducer, with the multiple fingers of the first region having a first pitch. The at least one interdigital transducer also includes a second region having multiple other fingers arranged to include at least two adjacent fingers extending from a same busbar of the at least one interdigital transducer, with the multiple other fingers of the second region having a second pitch different from the first pitch.

BRIEF DESCRIPTION OF DRAWINGS

FIG. 4-1 illustrates an example implementation of a double-mode surface-acoustic-wave filter using a thin-film surface-acoustic-wave filter stack.

FIG. 4-2 illustrates an example implementation of a double-mode surface-acoustic-wave filter using a high-quality temperature-compensated surface-acoustic-wave filter stack.

FIG. 16 is a flow diagram illustrating an example process for manufacturing a double-mode surface-acoustic-wave filter having a modulated interdigital transducer.

DETAILED DESCRIPTION

Figure 1:
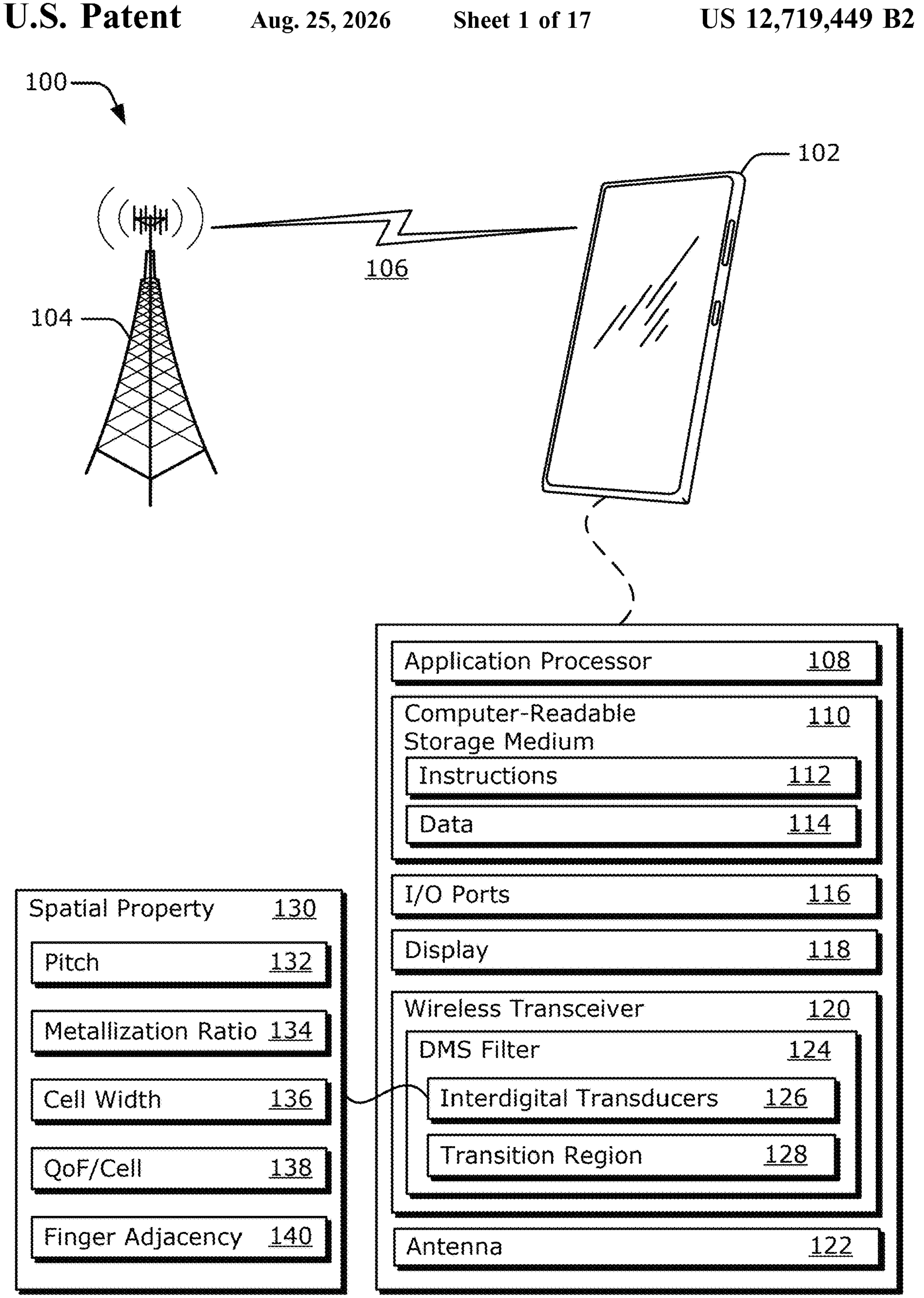
FIG. 1 illustrates an example operating environment for a double-mode surface-acoustic-wave filter having a modulated interdigital transducer (IDT).

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters" or "microacoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband, such as frequencies within its stopband). Using piezoelectric material as a vibrating medium, the acoustic filter operates by transforming an electrical signal wave that is propagating along an electrical conductor into an acoustic wave (e.g., an acoustic signal wave) that forms across the piezoelectric material, which can filter certain frequencies. The acoustic wave is then converted back into an electrical filtered signal. The acoustic filter can include an electrode structure that transforms or converts between the electrical waves and the acoustic waves.

The acoustic wave forms across the piezoelectric material and has a velocity with a magnitude that is significantly less than a velocity of an electromagnetic wave. Generally, the magnitude of the velocity of a wave is proportional to a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as mobile phones.

It can be challenging, however, to design a wideband acoustic filter with a compact design that also provides a sufficiently steep skirt for the frequency response of the acoustic filter. A frequency response of a bandpass filter can resemble the shape of the letter "n" with a graph of attenuation versus frequency. The top of the letter "n" roughly corresponds to a passband of the bandpass filter. The frequencies outside of the letter "n" roughly correspond to the stopband of the filter. The sides of the letter "n" are typically slanted in the zones transitioning between the passband and the lower and upper portions of the stopband. The slanted portion of the graph is sometimes referred to as the skirt of the frequency response.

Generally, a steeper skirt means that there is a more abrupt change between frequencies that are passed and frequencies that are blocked. Thus, a steeper skirt provides more options for using proximate frequencies that are "just outside" the passband of the filter. An electronic device may use multiple frequency bands, including one for a passband of a given filter. Other frequency bands may be above or below the passband, with one being closer than the other. If the closer other frequency band is above the passband of the given filter, then the high-frequency side (or "right" side) of the skirt may be the focus for providing a steep skirt to avoid inter-band interference. On the other hand, if the closer other frequency band is below the passband of the given filter, then the low-frequency side (or "left" side) of the skirt may be the focus for providing a steep skirt to avoid inter-band interference.

Another factor that may impact a shape or slope of a skirt portion of a frequency response is the acoustic material used for a SAW filter. Lithium niobate ($LiNbO_3$) 122 (LN122), for example, is a substrate for SAW filters with a relatively low velocity. This lower velocity allows filters to become relatively smaller. In contrast with most materials currently used for SAW filters, however, the sign of the reflection of an electrode is positive for an LN122 SAW filter. This positive sign of reflection causes the resonance frequency of, for instance, a uniform grating with two fingers per wavelength (λ) to appear at the upper stopband edge (or right skirt). Most materials that have heretofore been used for SAW filters have a negative reflection sign for the electrode; consequently, their resonance frequency is at the lower stopband edge (or left skirt).

The finger period of the interdigital transducers of a filter, such as double-mode SAW (DMS) filter (or sometimes referred to as dual-mode), are arranged such that their resonance frequencies occur within the passband. As a result, the upper stopband edge of each transducer in a DMS on a substrate material with positive reflection is above the left skirt of the filter. DMS filters are beneficial due to their smaller size, but they are used primarily in receive (Rx) filters because their power durability is less than that of ladder type filters.

In most systems, the Rx band is above the corresponding Tx band. Accordingly, the Rx filter may be designed to provide a steep left skirt. Generally, providing a steep skirt involves creating a long delay time for the signal. The delay time within a cavity at the transition of two interdigital transducers, each with two fingers per wavelength within the DMS track, is not sufficient due to the stopband of the interdigital transducers at higher frequencies, which result in insufficient penetration depth of the wave into the interdigital transducers. As used herein, employing two fingers per wavelength is referred to as a standard finger arrangement or normal modulation of an interdigital transducer.

In some approaches, the delay in the cavity between two interdigital transducers with a standard finger arrangement can be increased by increasing the distance between the two interdigital transducers. This additional space, however, is not used for any excitation. Consequently, the track length is increased to attain the pre-spacing impedance. In alternative approaches, a modified metallization ratio can be implemented with reduced (e.g., minimized) strip reflectivity located next to the transition areas of the interdigital transducers that are connected to the input port and the interdigital transducers that are connected to the output port. Limitations on the metallization ratio because of fabrication constraints, however, often do not allow the requisite reduction.

DMS filters with a steep left skirt can be produced using materials with a negative sign of the reflection of an electrode because the stopband of such interdigital transducers within the DMS is remarkable above the left skirt. This contrasts with substrate materials having a positive sign of the reflection of an electrode, such as LN122. In example implementations, for materials having a positive reflection sign, the stopband formed by the fingers close to the transition between two interdigital transducers is shifted in a way that does not prevent the requisite cavity length. Consequently, the modulation of these fingers likewise does not prevent the requisite delay time that can produce a steep skirt. Such modulated interdigital transducers enable the stopband of an interdigital transducer to be shifted away from the frequency with maximum excitation.

In some implementations, interdigital transducers are modulated with cells having a length of $n\lambda$ and $2n+1$ fingers within each cell, with A corresponding to a wavelength targeted by the filter. Within each cell, the fingers are connected to alternating busbars. The arrangement of a linear group of such cells results in a finger spatial property (e.g., a property geometry) in which there are two adjacent fingers from two different cells connected at the same busbar after a length of $n\lambda$. These two adjacent fingers are not separated by an intervening finger from an opposite busbar. Examples of such a repetitive cellular arrangement are described herein generally, including with reference to FIG. 9 for specific examples where n=2, n=3, and n=4.

The finger period in such cells is $n\lambda/(2n+1)$, and the corresponding stopband is consequently shifted towards higher frequencies compared to a normal finger cell with a finger period of $\lambda/2$. Relatively smaller values for n in this formula result in relatively smaller finger periods compared to larger values for n. Process limits regarding a minimum structure width may impact design considerations. Relatively larger values for n reduce the frequency shift between maximum excitation below the stopband and a boundary of the stopband. A reasonable upper limit for n can therefore result from the stopband width. For instance, the higher the reflectivity per strip, and therefore the higher the width of the stopband, the lower the maximum effective value for n may be.

DMS filters solely having interdigital transducers that are completely modulated in accordance with the cellular scheme described above may not be suitable for wideband filters. This is because the cavity in such cases is formed by the reflectors at both ends of the DMS track. A very long cavity can result in a very small distance in frequency between frequency dips that are next to each other. Additionally, an unnecessarily long acoustical delay leads to increased insertion attenuation due to acoustic propagation losses. Accordingly, an interdigital transducer of a DMS filter may include some fingers that are modulated based on the described cellular scheme that produces adjacent fingers and may include other fingers that are modulated differently, such as with a standard two fingers per wavelength.

In example implementations at the DMS level, a DMS filter includes three interdigital transducers laid out in a symmetric track with reflectors at both ends. In this three-interdigital-transducer DMS filter, each interdigital transducer includes a region with two fingers per wavelength and a region having some modulated cells as described herein. In example aspects, the modulated regions of the interdigital transducers face each other. For a better phase relationship, adjustments at the borders of these modulated regions within the interdigital transducers, as well as those between the interdigital transducers, can be implemented. To do so, the modulated region of a transducer can "start" with an incomplete modulated cell on the side of the modulated region that is adjacent to a standard finger region.

In some cases, such as for a relatively long modulated-cell region, a few strips can be removed at the end that faces toward an adjacent interdigital transducer. To form a smoother, more gradual pitch profile, adjustments result in a chirp with a varying pitch close to the ends of the identified regions. A few (e.g., two or more) floating or grounded metal strips may also be disposed between two adjacent interdigital transducers that are connected to different electrical ports (e.g., one input port and one output port).

In these manners, a double-mode surface-acoustic-wave filter can include at least one interdigital transducer having different regions. The different regions are modulated differently. In an example aspect, one region has normally modulated fingers in which each cell is one wavelength wide and has two fingers. Another region has fingers that are modulated such that each cell has a width of a multiple of the wavelength and includes an odd quantity of fingers that is based on the multiple. The pitch, for instance, can also vary between these two regions. Using these or other described techniques, the steepness of a skirt can be increased. For a material with a positive sign of reflection of an electrode, the left skirt can be made more steep. Moreover, for a material with a negative sign of reflection of an electrode, the right skirt can be steepened. This enables wireless transceivers to be designed that can operate with frequency bands that are closer together along the electromagnetic spectrum.

FIG. 1 illustrates an example environment 100 for operating a double-mode surface-acoustic-wave filter having a modulated interdigital transducer. In the environment 100, an example computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), 5th-generation (5G), or 6th-generation (6G) cellular (e.g., of the 3rd Generation Partnership Project (3GPP)); IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 via the antenna 122.

In the example shown in FIG. 1, the wireless transceiver 120 includes at least one double-mode surface-acoustic-wave filter 124 (DMS filter 124). The double-mode surface-acoustic-wave filter 124 can be implemented as, for example, a longitudinal-coupled double-mode surface-acoustic-wave (LDMS) filter. The double-mode surface-acoustic-wave filter 124 can be implemented using, for example, a thin-film surface-acoustic-wave (TFSAW) filter stack or a high-quality temperature-compensated surface-acoustic-wave (HQTC SAW) filter stack. In general, the double-mode surface-acoustic-wave filter 124 can excite at least two wave modes. In an example implementation, the double-mode surface-acoustic-wave filter 124 excites a main wave mode (e.g., a plate mode) and a cavity mode.

The double-mode surface-acoustic-wave filter 124 includes at least two interdigital transducers 126 and at least one transition region 128. A transition region 128 may be present between two adjacent interdigital transducers 126, span parts of two adjacent interdigital transducers 126, some combination thereof, and so forth. Additionally or alternatively, although the rectangle representing the transition region 128 is depicted separately from the interdigital transducers 126 in FIG. 1, each interdigital transducer 126 may include at least one transition region 128. Examples of interdigital transducers 126 and transition regions 128 are further described with respect to FIG. 3.

Each interdigital transducer 126 can include at least one spatial property 130. Further, at least one spatial property 130 of each of the interdigital transducers 126 can be substantially uniform (e.g., substantially steady, constant, or static) across a portion of the interdigital transducer 126, such as the transition region 128. In general, the term "substantially uniform" can mean that the spatial property changes by less than ±1% across a portion of a given region (e.g., across at least two pairs of adjacent fingers or across two cells within a transition region 128). For example, the value of the spatial property across a particular portion of a transition region 128 can change by ±1%, ±0.75%, ±0.50%, or less. This amount of variation can account for slight differences caused by process variations.

Examples of a spatial property 130 include a pitch 132, a metallization ratio 134, a cell width 136, a quantity of fingers per cell 138, and whether two fingers extending from a same busbar are adjacent to each other 140 (finger adjacency 140). The pitch 132 can represent an average distance between adjacent fingers of an interdigital transducer 126. The metallization ratio 134 represents an average width of adjacent fingers divided by the pitch 132. The metallization ratio 134 can be represented by the Greek letter eta (n).

The cell width 136 relates to a width of an area of the interdigital transducer 126 in which a finger pattern repeats. For example, the cell width 136 can be the smallest quantity of fingers that form a repeated finger pattern. The cell width 136 can be measured or defined in terms of a targeted or corresponding wavelength ($\lambda$), such as a multiple of the wavelength ($n\lambda$). The quantity of fingers per cell 138 pertains to how many fingers are present in each cell. For normal modulation, with two finger per wavelength, the cell is one wavelength wide and includes two fingers. Described implementations, however, have more fingers per cell with greater cell widths.

Finger adjacency 140 corresponds to whether two fingers that extend from a same busbar are adjacent in a given interdigital transducer 126. Example implementations include an odd quantity of fingers per cell, so there can be two adjacent fingers extending from a same busbar, with the two adjacent fingers being part of different cells. Examples are described below with reference to FIGS. 6, 7, and 9.

The double-mode surface-acoustic-wave filter 124 can be implemented as a wideband filter. For instance, a bandwidth of the double-mode surface-acoustic-wave filter 124 can be greater than (including greater than or equal to) approximately 4% of a center frequency of its passband. In some implementations, this bandwidth enables the double-mode surface-acoustic-wave filter 124 to filter frequencies associated with multiple frequency bands. Examples of the wireless transceiver 120 are described next with respect to FIG. 2.

Figure 2:
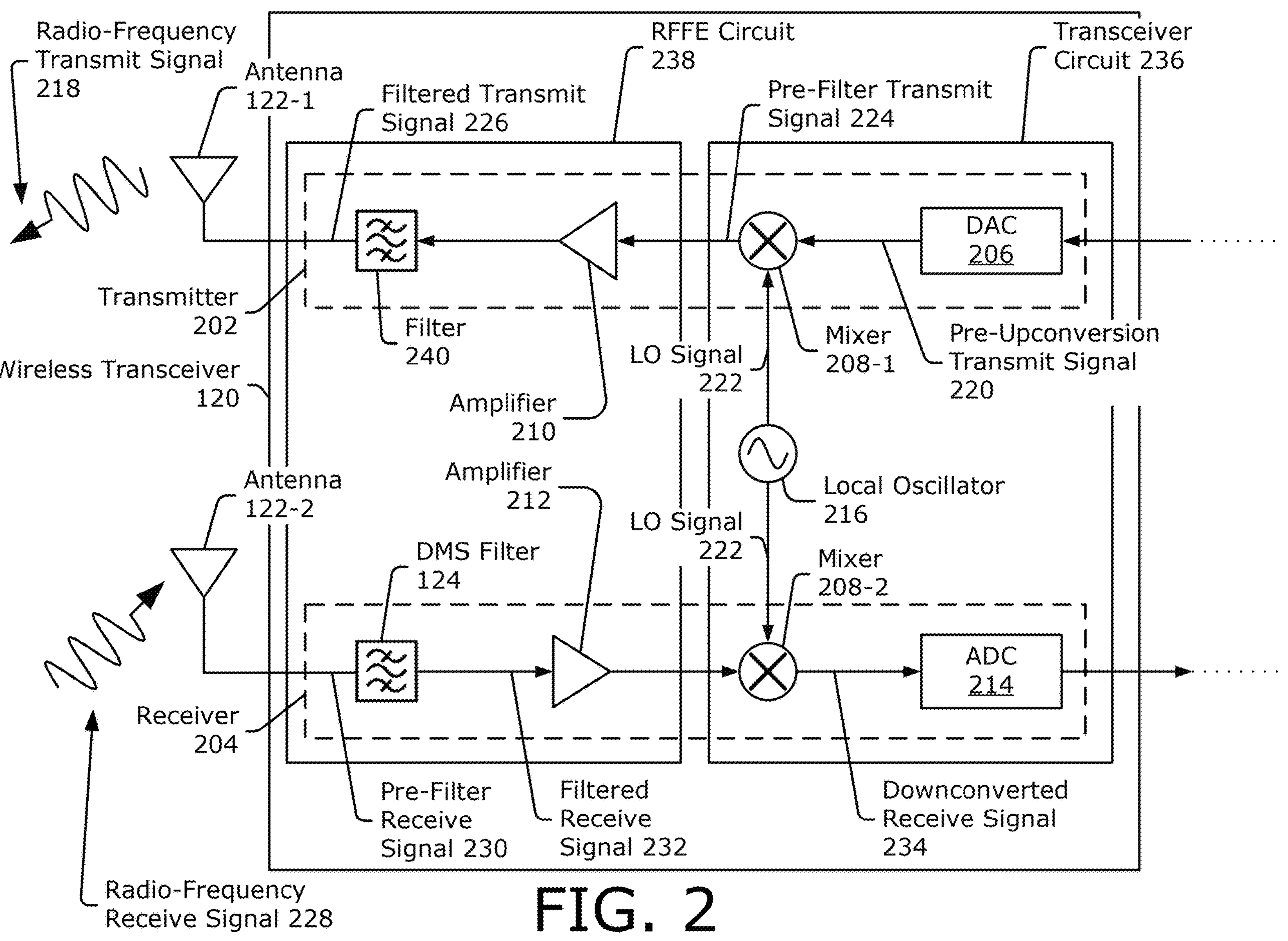
FIG. 2 illustrates an example wireless transceiver including a double-mode surface-acoustic-wave filter that can have a modulated interdigital transducer.

FIG. 2 illustrates an example wireless transceiver 120 including a double-mode surface-acoustic-wave filter 124 that can have a modulated interdigital transducer. Generally, the wireless transceiver 120 can communicate a wireless signal via the at least one antenna 122. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one filter 240. The filter 240 can be implemented as an acoustic filter, which may be a bandpass filter.

The receiver 204 includes at least one double-mode surface-acoustic-wave filter 124, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem or a baseband or communications processor).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across such circuits in these implementations. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 or the analog-to-digital converter 214 can be implemented on another separate circuit that may include the application processor 108 or the modem. The radio-frequency front-end circuit 238 includes the amplifier 210 of the transmitter 202, the filter 240 of the transmitter 202, the double-mode surface-acoustic-wave filter 124 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and may include some noise or unwanted frequencies, such as a harmonic frequency. The amplifier 210 amplifies the pre-filter transmit signal 224 and passes the amplified pre-filter transmit signal 224 to the filter 240.

The filter 240 filters the amplified pre-filter transmit signal 224 to generate a filtered transmit signal 226. As part of the filtering process, the filter 240 attenuates the noise or unwanted frequencies within the pre-filter transmit signal 224. The transmitter 202 provides the filtered transmit signal 226 to the antenna 122-1 for transmission. The emanated or transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The double-mode surface-acoustic-wave filter 124 accepts the received radio-frequency receive signal 228, which is represented by a pre-filter receive signal 230. The double-mode surface-acoustic-wave filter 124 filters noise or unwanted frequencies within the pre-filter receive signal 230 to generate a filtered receive signal 232. As described herein (e.g., with reference to FIGS. 5, 7, 11, and 12), the double-mode surface-acoustic-wave filter 124 (e.g., as a receive filter of the receiver 204) can include at least one DMS track. A receive filter can, however, include at least one DMS track and one or more other acoustic elements (e.g., microacoustic resonators).

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem or the baseband or communications processor). Although the wireless transceiver 120 is depicted with one mixer 208 in each of the transmitter 202 and the receiver 204, the wireless transceiver 120 can alternatively be realized with a superheterodyne architecture.

Generally, FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which the double-mode surface-acoustic-wave filter 124 may be included. For example, the double-mode surface-acoustic-wave filter 124 can be integrated within a duplexer or diplexer of the wireless transceiver 120. Also, some implementations of the wireless transceiver 120 can implement the filter 240 using a double-mode surface-acoustic-wave filter 124. Additionally, a double-mode surface-acoustic-wave filter 124 can be implemented in a computing device 102 (of FIG. 1) outside of a wireless transceiver 120. Example implementations of a double-mode surface-acoustic-wave filter 124 are described next with reference to FIG. 3.

Figure 3:
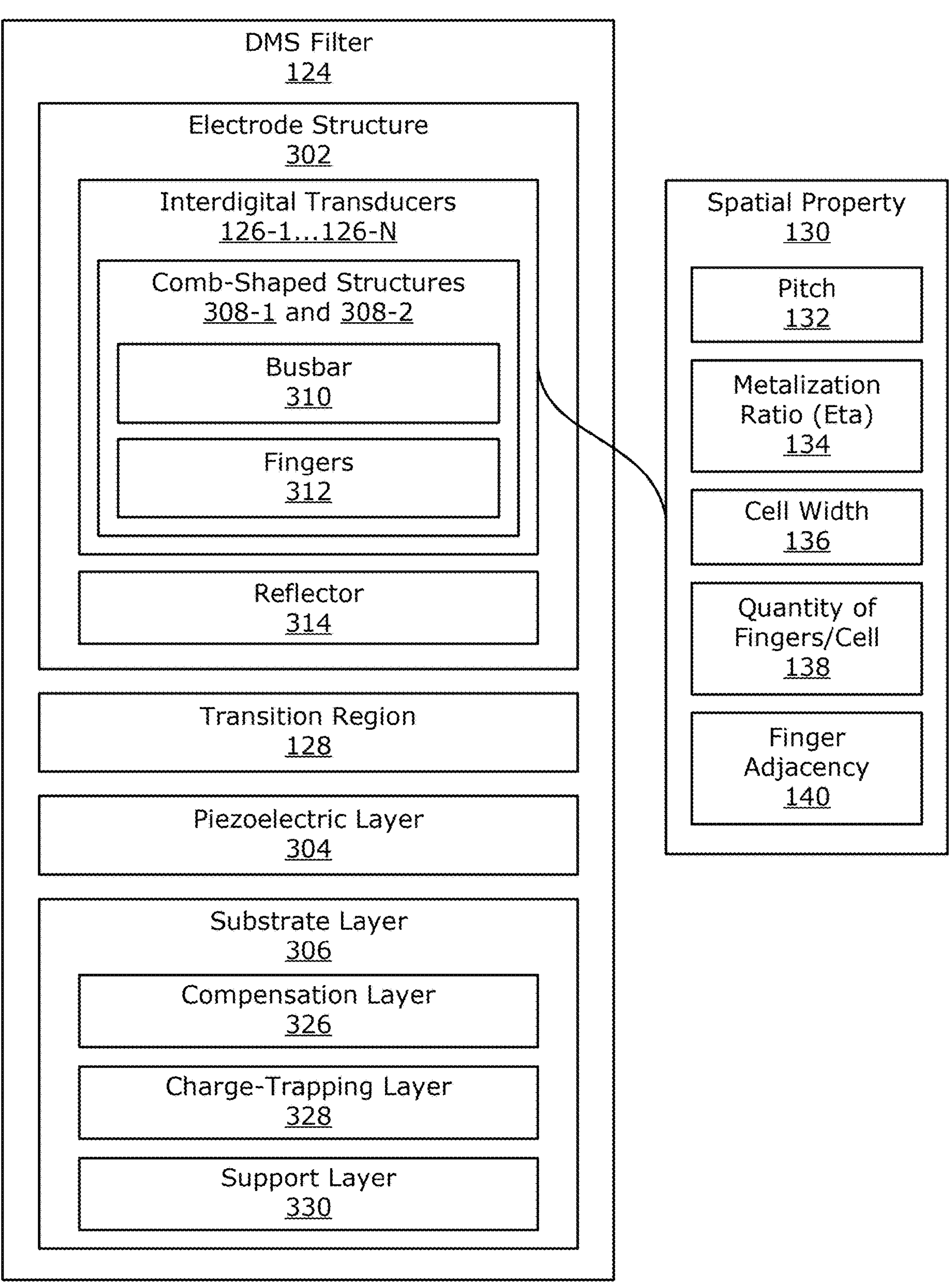
FIG. 3 illustrates example components of a double-mode surface-acoustic-wave filter that can have a modulated interdigital transducer.

FIG. 3 illustrates example components of a double-mode surface-acoustic-wave filter 124 that can have a modulated interdigital transducer 126. In the depicted configuration, the example double-mode surface-acoustic-wave filter 124 includes an electrode structure 302, a piezoelectric layer 304, and at least one substrate layer 306. The electrode structure 302 comprises an electrically conductive material, such as metal, to form electrode(s) and can include one or more layers. The one or more layers can include one or more metal layers and can optionally include one or more adhesion layers. As an example, the metal layers can be composed of aluminium (Al), copper (Cu), silver (Ag), gold (Au), tungsten (W), platinum (Pt), or some combination or doped version thereof. The adhesion layers can be composed of, for example, chromium (Cr), titanium (Ti), molybdenum (Mo), or some combination thereof.

The electrode structure 302 can include two or more interdigital transducers 126-1, 126-2, . . . 126-N, with N being an integer greater than one in this context. The interdigital transducers 126-1 . . . 126-N convert an electrical signal into an acoustic wave and convert the acoustic wave into a filtered electrical signal. Each interdigital transducer 126 includes at least two comb-shaped structures 308-1 and 308-2. Each comb-shaped structure 308-1 and 308-2 includes a busbar 310 (e.g., a conductive segment or rail) and multiple fingers 312 (e.g., electrode fingers). The electrode structure 302 can also optionally include two or more reflectors 314. In an example implementation, the multiple interdigital transducers 126-1 to 126-N are arranged between two reflectors 314, which reflect the acoustic wave back towards the multiple interdigital transducers 126-1 to 126-N. Examples of the electrode structure 302 and the interdigital transducers 126-1 . . . 126-N are further described with respect to FIGS. 4-1 to 7, 9, 11, and 12.

One or more physical characteristics of the interdigital transducers 126-1 . . . 126-N can be characterized by the spatial property 130. In particular, the spatial property 130 describes the positioning, arrangement, patterning, and/or physical characteristic(s) of the fingers 312 within the electrode structure 302. Example spatial properties 130 include the pitch 132, the metallization ratio 134, the cell width 136, the quantity of fingers per cell 138, and the finger adjacency 140. These spatial properties 130 can vary across the electrode structure 302 on an individual basis or in concert with one another.

In some cases, the transition region 128 represents one or more sets of fingers 312 respectively positioned at adjacent outer edges of two adjacent interdigital transducers (e.g., IDTs 126-1 and 126-2). However, a transition region 128 can also or instead represent one or more sets of fingers 312 present within a single interdigital transducer 126. Examples of the transition region 128 are further described with respect to FIG. 5 and subsequent drawings. These figures also depict examples of different combinations of spatial properties 130 for different sets of fingers 312.

Generally, the techniques for implementing a double-mode surface-acoustic-wave filter 124 having at least one transition region 128 with different spatial properties 130 can apply to different types of DMS filters. For example, these techniques can be employed with filter stacks that do not include a compensation layer (e.g., the thin-film surface-acoustic-wave filter stack of FIG. 4-1) and filter stacks that include the compensation layer (e.g., the high-quality temperature-compensated filter stack of FIG. 4-2).

In example implementations, the piezoelectric layer 304 can be implemented using a variety of different materials that exhibit piezoelectric properties (e.g., can transfer mechanical energy into electrical energy or electrical energy into mechanical energy). Example types of material include lithium niobate ($LiNbO_3$), lithium tantalate ($LiTaO_3$), quartz, aluminium nitride (AlN), aluminium scandium nitride (AlScN), or some combination thereof. In general, the material that forms the piezoelectric layer 304 can have a crystalline structure. This crystalline structure is defined by an ordered arrangement of particles (e.g., atoms, ions, or molecules). In some implementations, the piezoelectric layer 304 has an electromechanical coupling factor ($k^2$) that is greater than or equal to approximately 4%.

The substrate layer 306 includes one or more sublayers that can support passivation, temperature compensation, power handling, mode suppression, and so forth. As an example, the substrate layer 306 can include at least one compensation layer 326, at least one charge-trapping layer 328, at least one support layer 330, or some combination thereof. These sublayers can be considered part of the substrate layer 306 or their own separate layers.

The compensation layer 326 can provide temperature compensation to enable the double-mode surface-acoustic-wave filter 124 to achieve a target temperature coefficient of frequency based on the thickness of the piezoelectric layer 304. In some implementations, a thickness of the compensation layer 326 can be tailored to provide mode suppression (e.g., suppress a spurious plate mode). In example implementations, the compensation layer 326 can be implemented using at least one silicon dioxide ($SiO_2$) layer, at least one doped silicon dioxide layer, at least one silicon nitride layer, at least one silicon oxynitride layer, or some combination thereof. In some applications, the substrate layer 306 may not include, for instance, the compensation layer 326 to reduce cost of the double-mode surface-acoustic-wave filter 124.

The charge-trapping layer 328 can trap induced charges at the interface between the compensation layer 326 and the support layer 330 in order to, for instance, suppress nonlinear substrate effects. The charge-trapping layer 328 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminium nitride (AlN) layer, diamond-like carbon (DLC), diamond, or some combination thereof.

The support layer 330 can enable the acoustic wave to form across the surface of the piezoelectric layer 304 and reduce the amount of energy that leaks into the substrate layer 306. In some implementations, the support layer 330 can also act as a compensation layer 326. In general, the support layer 330 is composed of material that is nonconducting and provides isolation. For example, the support layer 330 can be formed using silicon (Si) material (e.g., a doped high-resistive silicon material), sapphire material (e.g., aluminium oxide ($Al_2O_3$)), silicon carbide (SiC) material, fused silica material, quartz, glass, diamond, or some combination thereof. In some implementations, the support layer 330 has a relatively similar thermal expansion coefficient (TEC) as the piezoelectric layer 304. The support layer 330 can also have a particular crystal orientation to support the suppression or attenuation of spurious modes.

In some aspects, the double-mode surface-acoustic-wave filter 124 can be considered a resonator or formed from multiple resonators. Sometimes the double-mode surface-acoustic-wave filter 124 can be connected to other resonators associated with the same or different layer stacks than the double-mode surface-acoustic-wave filter 124. Examples of the electrode structure 302, the piezoelectric layer 304, and the substrate layer 306 are described next with respect to FIGS. 4-1 and 4-2.

Figure 4:
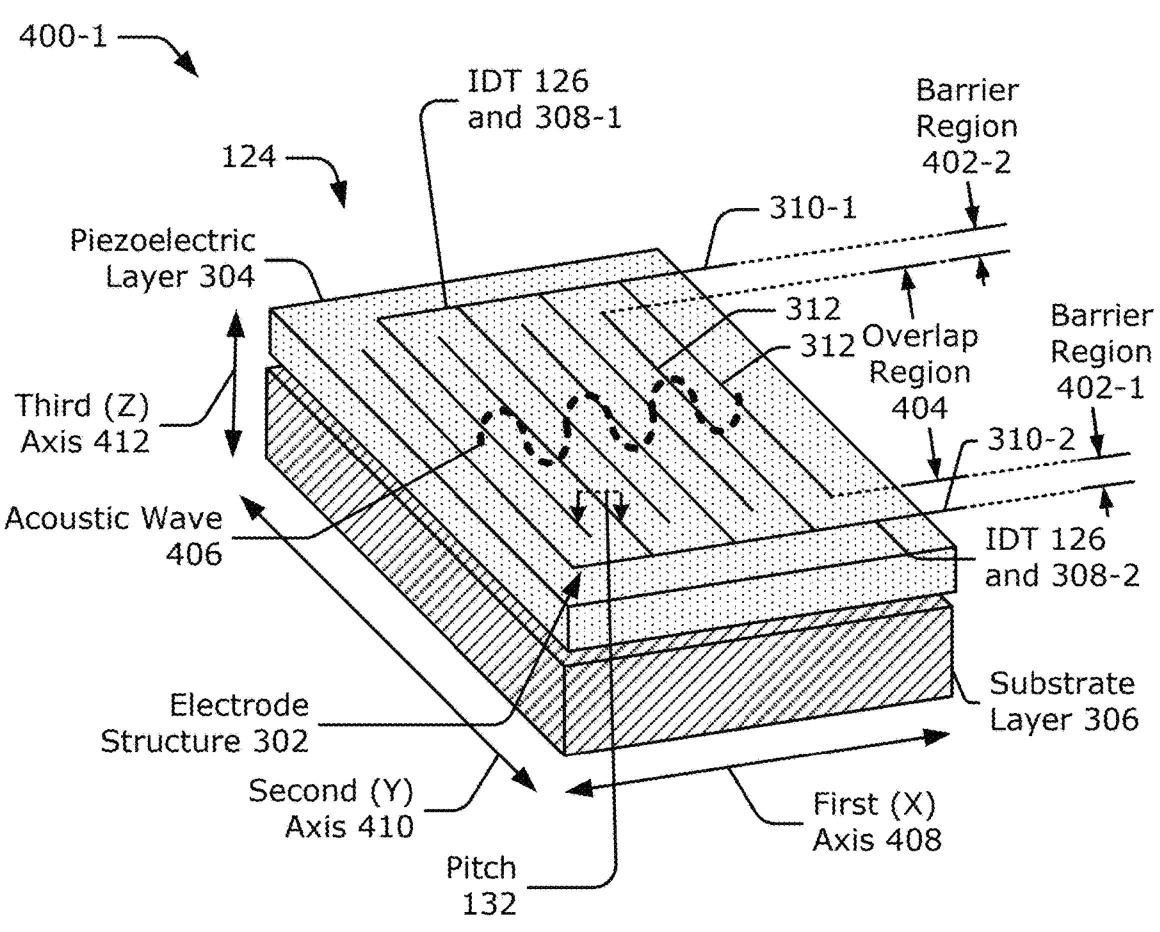
Figure 1:
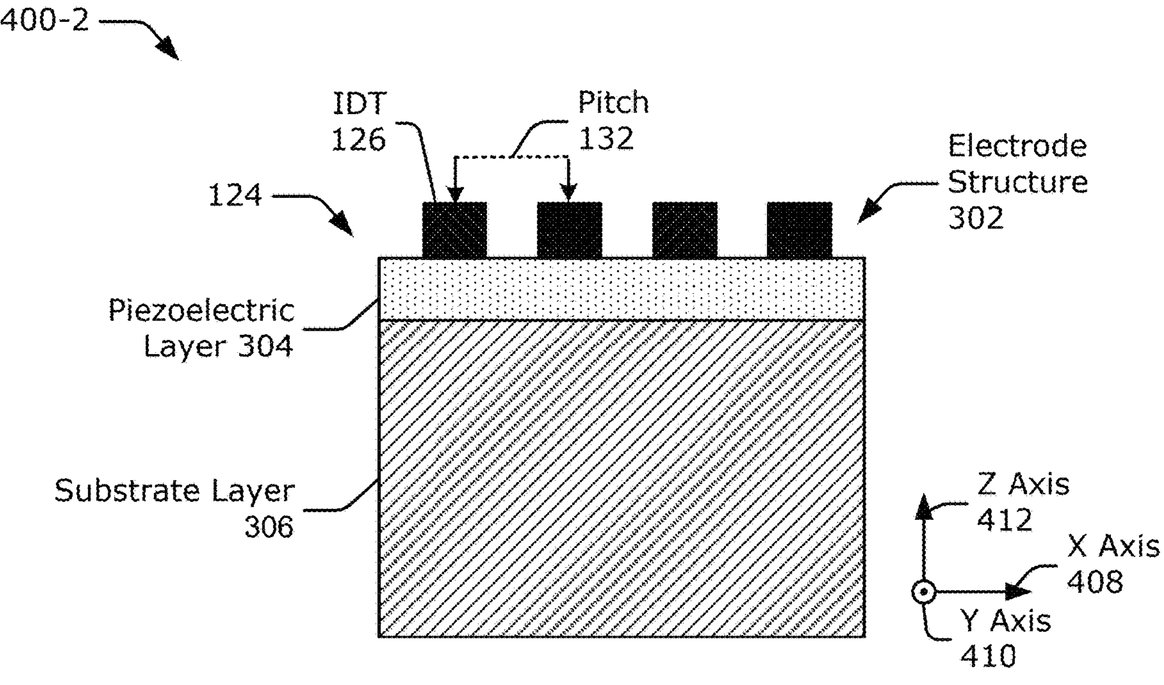
Figure 4:
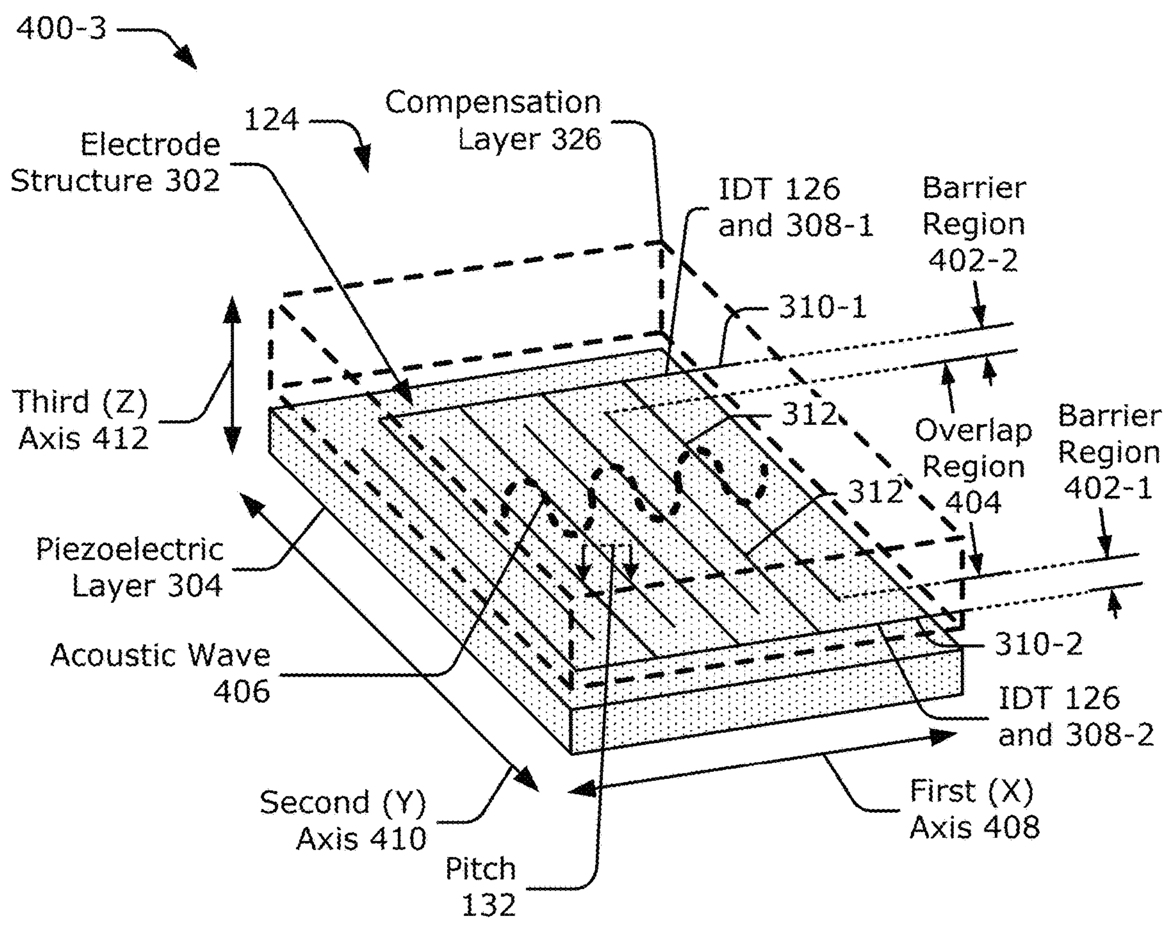
Figure 2:
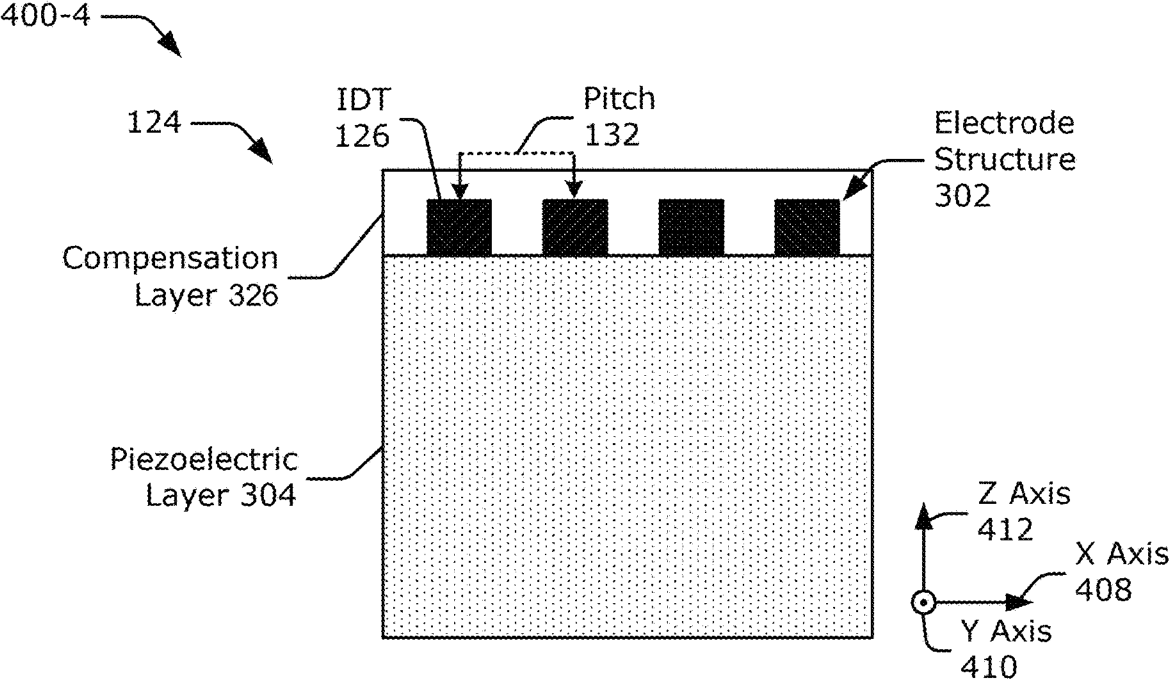

FIG. 4-1 illustrates an example implementation of a double-mode surface-acoustic-wave filter 124 using a thin-film surface-acoustic-wave filter stack. A three-dimensional perspective view 400-1 of the double-mode surface-acoustic-wave filter 124 is shown at the top of FIG. 4-1, and a two-dimensional cross-section view 400-2 of the double-mode surface-acoustic-wave filter 124 is shown at the bottom of FIG. 4-1.

The double-mode surface-acoustic-wave filter 124 includes at least one electrode structure 302, at least one piezoelectric layer 304, and at least one substrate layer 306. In the depicted configuration shown in the two-dimensional cross-section view 400-2, the piezoelectric layer 304 is disposed between the electrode structure 302 and the substrate layer 306. A portion of the electrode structure 302 depicted in FIG. 4-1 includes at least a portion of one interdigital transducer 126 (IDT 126). The electrode structure 302 can include one or more additional interdigital transducers 126 not explicitly shown in FIG. 4-1. Also, the interdigital transducer 126 depicted in FIG. 4-1 can include additional fingers 312 not explicitly shown in FIG. 4-1.

In the three-dimensional perspective view 400-1, the interdigital transducer 126 is shown to have two comb-shaped structures 308-1 and 308-2 with fingers 312 extending from two busbars 310-1 and 310-2 towards each other. As shown, the fingers 312 are arranged in an interlocking manner in between the two busbars 310-1 and 310-2 of the interdigital transducer 126 (e.g., arranged in an interdigitated manner). In other words, the fingers 312 connected to a first busbar 310-1 extend towards a second busbar 310-2 but do not connect to the second busbar 310-2. As such, there is a first barrier region 402-1 (e.g., a transversal gap region) between the ends of these fingers 312 of the first busbar 310-1 and the second busbar 310-2. Likewise, fingers 312 connected to the second busbar 310-2 extend towards the first busbar 310-1 but do not connect to the first busbar 310-1. There is therefore a second barrier region 402-2 between the ends of these fingers 312 from the second busbar 310-2 and the first busbar 310-1.

In the direction along the busbars 310-1 and 310-2, there is an overlap region 404 where a portion of one finger 312 overlaps with a portion of an adjacent finger 312. In FIG. 4-1, by way of example only, two adjacent fingers extend from different busbars 310-1 and 310-2. This overlap region 404 may be referred to as the aperture, track, or active region where electric fields are produced between fingers 312 to cause an acoustic wave 406 to form at least in this region of the piezoelectric layer 304.

A physical periodicity of the fingers 312 is referred to as a pitch 132 of the interdigital transducer 126. The pitch 132 may be indicated or represented in various ways. For example, in certain aspects, the pitch 132 may correspond to a magnitude of a distance between adjacent fingers 312 of the interdigital transducer 126 in the overlap region 404. This distance may be defined, for example, as the distance between center points of each of the fingers 312. The distance may be generally measured between a right (or left) edge of one finger 312 and the right (or left) edge of an adjacent finger 312 when the fingers 312 have uniform widths. In certain aspects, an average of distances between adjacent fingers 312 of the interdigital transducer 126 may be used for the pitch 132 of a given section of the overlap region 404 along the first and second busbars 310-1 and 310-2. The frequency at which the piezoelectric layer 304 vibrates is a main-resonance frequency of the electrode structure 302. The frequency is determined at least in part by the pitch 132 of the interdigital transducer 126 in addition to other properties of the double-mode surface-acoustic-wave filter 124.

In the three-dimensional perspective view 400-1, the double-mode surface-acoustic-wave filter 124 is defined by a first (X) axis 408, a second (Y) axis 410, and a third (Z) axis 412. The first axis 408 and the second axis 410 are parallel to a planar surface of the piezoelectric layer 304, and the second axis 410 is perpendicular to the first axis 408. The third axis 412 is normal (e.g., substantially perpendicular or orthogonal) to the planar surface of the piezoelectric layer 304. The busbars 310-1 and 310-2 of the interdigital transducer 126 are oriented to be parallel to the first axis 408. The fingers 312 of the interdigital transducer 126 are orientated to be parallel to the second axis 410. Also, an orientation of the piezoelectric layer 304 can cause the acoustic wave 406 to mainly form in a direction along or parallel to the first axis 408. As such, the acoustic wave 406 forms in a direction that is substantially perpendicular or orthogonal to the direction of the fingers 312 of the interdigital transducer 126.

FIG. 4-2 illustrates an example implementation of a double-mode surface-acoustic-wave filter 124 using a high-quality temperature-compensated surface-acoustic-wave filter stack. A three-dimensional perspective view 400-3 of the double-mode surface-acoustic-wave filter 124 is shown at the top of FIG. 4-2, and a two-dimensional cross-section view 400-4 of the double-mode surface-acoustic-wave filter 124 is shown at the bottom of FIG. 4-2.

The double-mode surface-acoustic-wave filter 124 includes at least one electrode structure 302, at least one piezoelectric layer 304, and at least one compensation layer 326. The compensation layer 326 can provide temperature compensation to enable the double-mode surface-acoustic-wave filter 124 to achieve a target temperature coefficient of frequency. In example implementations, the compensation layer 326 can be implemented using at least one silicon dioxide layer.

In the depicted configuration shown in the two-dimensional cross-section view 400-4, the electrode structure 302 is disposed between the piezoelectric layer 304 and the compensation layer 326. The piezoelectric layer 304 can form a substrate of the double-mode surface-acoustic-wave filter 124.

The electrode structure 302 of the high-quality temperature-compensated filter stack can be similar to the electrode structure 302 described above with respect to the thin-film surface-acoustic-wave filter stack of FIG. 4-1. Likewise, the piezoelectric layer 304 of the high-quality temperature-compensated filter stack can be similar to the piezoelectric layer 304 described above with respect to the thin-film surface-acoustic-wave filter stack of FIG. 4-1. The piezoelectric layer 304 of the high-quality temperature-compensated surface-acoustic-wave filter stack, however, can be thicker than the piezoelectric layer 304 of the thin-film surface-acoustic-wave filter stack of FIG. 4-1. Similar to the thin-film surface-acoustic-wave filter stack of FIG. 4-1, the high-quality temperature-compensated surface-acoustic-wave filter stack of FIG. 4-2 can also include the barrier regions 402-1 and 402-2 and the overlap region 404.

One of ordinary skill in the art can appreciate the variety of filter stacks in which the double-mode surface-acoustic-wave filter 124 can be implemented. It should be appreciated that although a certain quantity of fingers 312 are illustrated in FIGS. 4-1 and 4-2, the quantity of actual fingers, the lengths and widths of the fingers 312 and the busbars 310-1 and 310-2, the pitch of the finger 312, and so forth may be different in a given physical implementation. Such parameters depend on the particular application and targeted filter characteristics. In addition, the double-mode surface-acoustic-wave filter 124 can include multiple interdigital transducers 126 to achieve a given filter transfer function. An example electrode structure 302 with multiple interdigital transducers 126 is described next with reference to FIG. 5.

Figure 5:
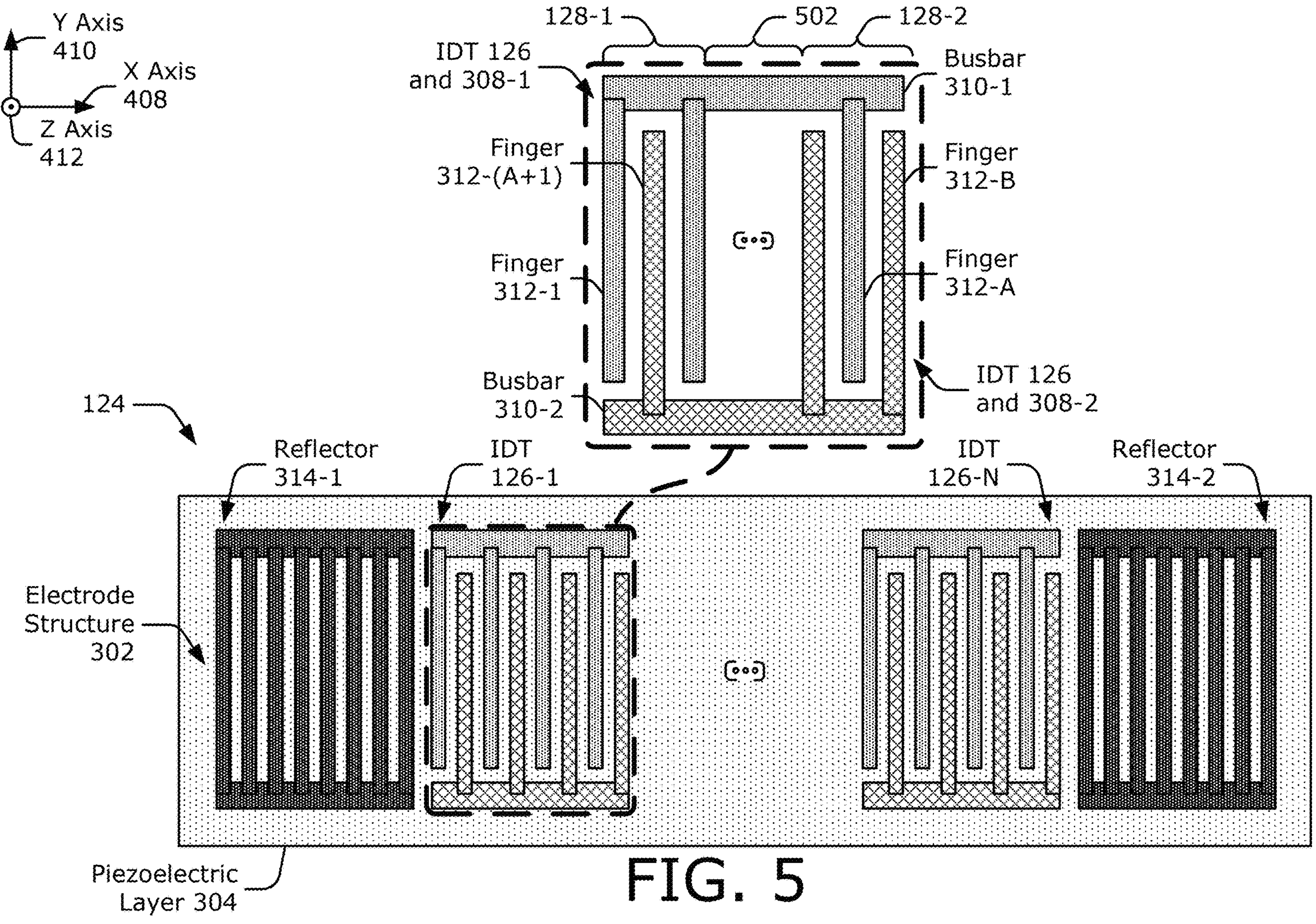
FIG. 5 illustrates an example electrode structure of a double-mode surface-acoustic-wave filter that can include a modulated interdigital transducer.

FIG. 5 illustrates an example electrode structure 302 of a double-mode surface-acoustic-wave (DMS) filter 124 that can include a modulated interdigital transducer 126. In the depicted configuration, the electrode structure 302 includes multiple interdigital transducers 126-1 to 126-N, where N represents a positive integer generally, to provide a DMS track. In example implementations, the variable N can be equal to 3, 4, 5, 7, and so forth. Thus, a DMS track can include an arbitrary number of interdigital transducers. With reference also to FIG. 2, a receive filter (e.g., the DMS filter 124) or a transmit filter 240 can include at least one DMS track.

The electrode structure 302 also includes a first reflector 314-1 and a second reflector 314-2. The interdigital transducers 126-1 to 126-N are arranged between the first and second reflectors 314-1 and 314-2. The interdigital transducers 126-1 to 126-N can be, for instance, arranged so as to be spatially or physically positioned sequentially or in series together between the first and second reflectors 314-1 and 314-2. With this positioning, the reflectors 314-1 and 314-2 reflect the acoustic wave 406 back towards the interdigital transducers 126-1 to 126-N. Each reflector 314-1 and 314-2 within the electrode structure 302 can have two busbars 310 and a grating structure of conductive finger-like strips that connect to both busbars 310. In some implementations, a pitch of the reflector 314 can be similar to a pitch 132 of an interdigital transducer 126 to reflect the acoustic wave 406 in the resonant frequency range.

As shown, each interdigital transducer 126 includes a first busbar 310-1, a second busbar 310-2, and multiple fingers 312-1 to 312-B, where B represents a positive integer. The first busbar 310-1 and the fingers 312-1 to 312-A form at least a portion of the first comb-shaped structure 308-1, where A represents a positive integer that is less than B. The fingers 312-1 to 312-A are connected to the first busbar 310-1 and extend along the second (Y) axis 410 towards the second busbar 310-2 without connecting to the second busbar 310-2. The second busbar 310-2 and the fingers 312-(A+1) to 312-B form at least a portion of the second comb-shaped structure 308-2. The fingers 312-(A+1) to 312-B are connected to the second busbar 310-2 and extend along the second (Y) axis 410 towards the first busbar 310-1 without connecting to the first busbar 310-1.

The fingers 312 within an interdigital transducer 126 can be associated with, for example, a first transition region 128-1, a central region 502, or a second transition region 128-2. In the depicted example, the central region 502 is positioned between the first and second transition regions 128-1 and 128-2 along the first axis 408. The first and second transition regions 128-1 and 128-2 are associated with opposite outer edges of the interdigital transducer 126. For instance, the first transition region 128-1 is associated with a “left” edge (as depicted in FIG. 5) of the interdigital transducer 126, and the second transition region 128-2 is associated with a “right” edge of the interdigital transducer 126. Although not explicitly shown, the first and second transition regions 128-1 and 128-2 can also include fingers 312 of an adjacent interdigital transducer 126. The central region 502 is associated with a center of the interdigital transducer 126 and does not include additional fingers 312 associated with the adjacent interdigital transducer 126. In other implementations, an interdigital transducer 126 can include more, fewer, and/or different regions as compared to those shown in FIG. 5. For example, an interdigital transducer 126 can include a transition region 128 that is not positioned at or otherwise associated with an edge of the interdigital transducer 126.

A transition region 128 can facilitate a smoother, less abrupt change along the track for the acoustic wave with respect to sets of fingers that have different spatial properties 130. At least one transition region 128 can include, for instance, portions of two adjacent interdigital transducers 126 that form a smooth, continuous transition, which may further include a quasi-periodic grating between adjacent elements. Additionally or alternatively, at least one transition region 128 can include finger portions within a single interdigital transducer 126 that form a smooth, continuous transition for a traveling acoustic wave. Generally, a region 128 can include different spatial properties 130 relative to those of one or more other regions 128. For example, the pitch 132, the metallization ratio 134, the cell width 136, the quantity of fingers per cell 138, or the finger adjacency 140 of one or more interdigital transducers 126 can vary across the first axis 408, as further described next, starting with reference to FIG. 6.

Figure 6:
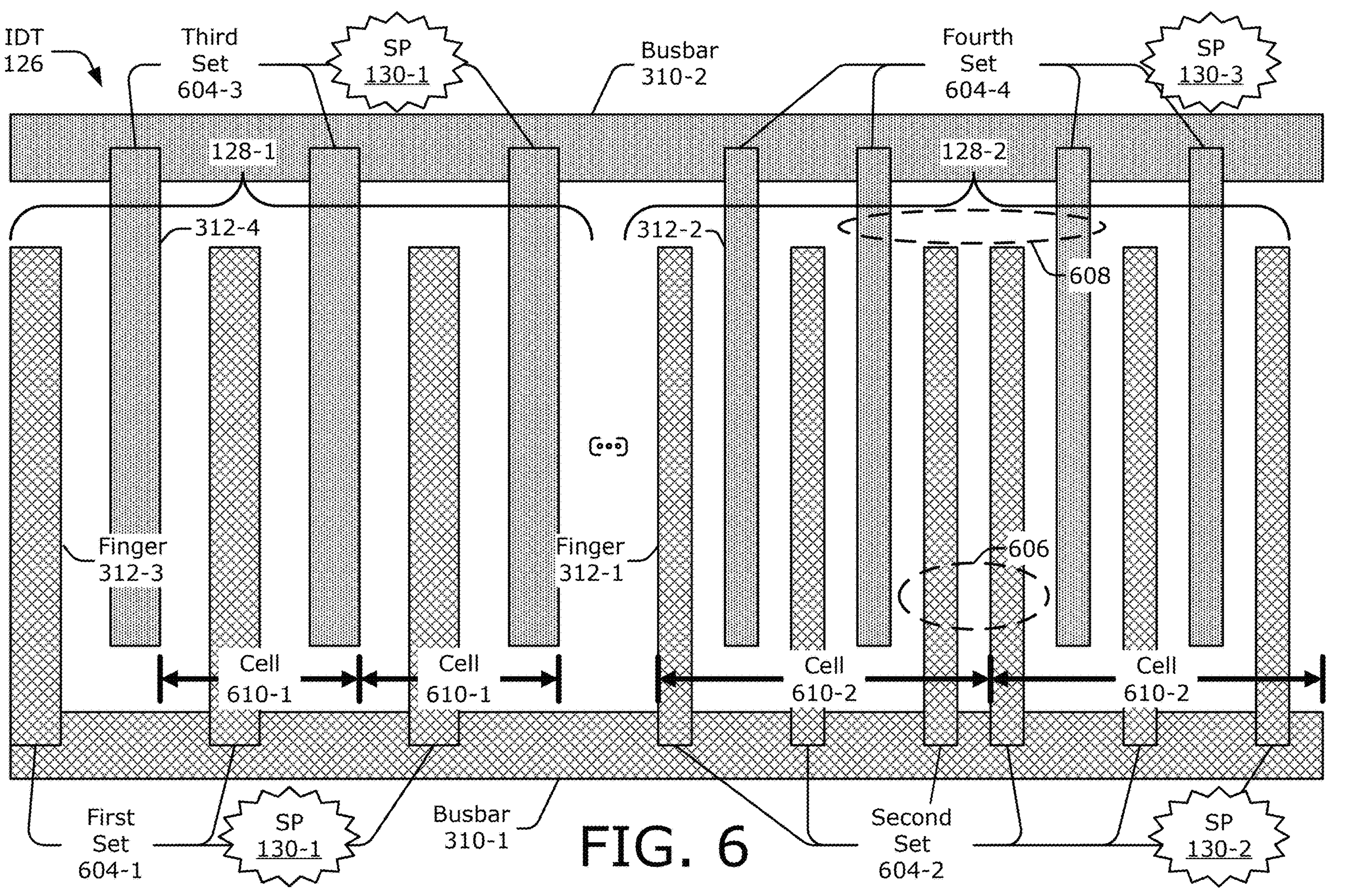
FIG. 6 illustrates an example of a modulated interdigital transducer including multiple regions having sets of fingers, including a region with adjacent fingers.

FIG. 6 illustrates an example of a modulated interdigital transducer 126 including multiple regions having sets of fingers, including a region with adjacent fingers along a same busbar. For clarity, the shading indicative of the piezoelectric layer 304 is omitted from FIGS. 6, 7, and 9. As illustrated, the interdigital transducer 126 includes at least two regions: a first region 128-1 and a second region 128-2. The interdigital transducer 126 also includes at least two busbars: a first busbar 310-1 and a second busbar 310-2. The regions may differ from each other in one or more aspects of a spatial property 130 (SP 130). Example aspects of a spatial property 130 include pitch 132, metallization ratio 134, cell width 136, and finger positioning.

Finger positioning can include, for example, fingers that extend from a same busbar and are adjacent to each other (finger adjacency 140) and fingers that extend from a same busbar that are spaced-apart by more than one intervening finger even though they are consecutively positioned along the same busbar (e.g., there is a gap between the consecutive fingers). As used herein, adjacent fingers are fingers (e.g., that extend from a same busbar) that have no intervening finger from either busbar (e.g., including from the opposing busbar). An example of adjacent fingers is shown at 606. Consecutive fingers are fingers (e.g., that extend from a same busbar) that have no intervening finger from the same busbar. Two consecutive fingers can therefore define a gap in which at least one finger from the opposing busbar is positioned. An example of consecutive fingers is shown at 608. Thus, adjacent fingers are also consecutive fingers, but consecutive fingers are not necessarily adjacent. Finger positioning can also include a quantity of fingers per cell 138 in the context of a given cell width 136.

In example implementations, a double-mode surface-acoustic-wave filter 124 (e.g., of FIGS. 1 to 5) includes at least one interdigital transducer 126. The interdigital transducer 126 includes a first busbar 310-1, a second busbar 310-2, and multiple fingers 312 extending from the first busbar 310-1 toward the second busbar 310-2. In FIG. 6, for instance, these multiple fingers 312 can include those fingers 312 having a cross-hatched fill pattern. Two examples of such fingers are explicitly indicated in FIG. 6 as fingers 312-1 and 312-3.

Of these multiple fingers 312 having a cross-hatched fill pattern, there is a first set of fingers 604-1 having a first spatial property 130-1. The first set of fingers 604-1 includes the finger 312-3. These multiple fingers 312 also include a second set of fingers 604-2 having a second spatial property 130-2 that is different from the first spatial property 130-1. The second set of fingers 604-2 includes the finger 312-1. In FIG. 6, the second spatial property 130-2 includes at least two fingers of the second set of fingers 604-2 being positioned adjacent to each other, an example of which is indicated at 606.

The second set of fingers 604-2 can be positioned adjacent to the first set of fingers 604-1 along the first busbar 310-1 of the at least one interdigital transducer 126. Alternatively, another region (e.g., a central region 502 of FIG. 5) with another set of fingers having a different modulation can be disposed between the first region 128-1 including the first set of fingers 604-1 and the second region 128-2 including the second set of fingers 604-2.

In some implementations, the first spatial property 130-1 of the first set of fingers 604-1 includes or is associated with an absence of adjacent fingers in the first set of fingers 604-1. In other words, for fingers extending from the first busbar 310-1 and having the first spatial property 130-1, consecutive fingers are nonadjacent inasmuch as there is a finger extending from the second busbar 310-2 that is positioned or disposed between each of the two consecutive fingers of the first busbar 310-1.

In some implementations, the second set of fingers 604-2 is positioned at or otherwise associated with an outer edge of the at least one interdigital transducer 126. Thus, the second set of fingers 604-2 can be part of a transition region with respect to another interdigital transducer 126 of a given double-mode surface-acoustic-wave filter 124. This is described further below with reference to FIG. 7.

In some cases, the first spatial property 130-1 can include a first pitch of the first set of fingers 604-1. The second spatial property 130-2 can include a second pitch of the second set of fingers 604-2, with the second pitch being different from the first pitch. For example, the second pitch can be less than the first pitch, or vice versa. As depicted in FIG. 6, the second pitch of the fingers in the second region 128-2 is smaller than the first pitch of the fingers in the first region 128-1. Additionally or alternatively, the first spatial property 130-1 can include a first metallization ratio of the first set of fingers 604-1. The second spatial property 130-2 can include a second metallization ratio of the second set of fingers 604-2, with the second metallization ratio being different from the first metallization ratio.

In example implementations, the at least one interdigital transducer 126 can further include multiple other fingers 312 extending from the second busbar 310-2 toward the first busbar 310-1. In FIG. 6, for instance, these multiple other fingers 312 can include those fingers 312 having a densely dotted fill pattern. Two examples of such fingers are explicitly indicated in FIG. 6 as fingers 312-2 and 312-4. Based on the first set of fingers 604-1 and the third set of fingers 604-3, the first region 128-1 can include multiple fingers 312 arranged so as to alternate fingers from different busbars 310-1 and 310-2 of the interdigital transducer 126.

Of these multiple other fingers 312 having the densely dotted fill pattern, there is a third set of fingers 604-3 having the first spatial property 130-1. The third set of fingers 604-3 includes the finger 312-4. These multiple other fingers 312 also include a fourth set of fingers 604-4 having a third spatial property 130-3. The fourth set of fingers 604-4 includes the finger 312-2. The third spatial property 130-3 includes at least two fingers of the fourth set of fingers 604-4 that are separated by a gap 608. The gap 608 has a width that is sufficient to permit the at least two fingers of the second set of fingers 604-2 that are positioned adjacent to each other (as indicated at 606) to be positioned between the at least two fingers of the fourth set of fingers 604-4 that define the gap 608. The at least two fingers of the fourth set of fingers 604-4 that define the gap 608 are nonadjacent to each other but consecutive along the second busbar 310-2.

As illustrated, each region 128 of FIG. 6 has a different cell 610. The first region 128-1 has a first cell 610-1. The first cell 610-1 can include, for example, two fingers per cell and a cell width of one wavelength (λ). The second region 128-2 has a second cell 610-2. The second cell 610-2 can include, for example, five fingers per cell and a cell width of two wavelengths (2λ). Other examples are described herein with particular reference to FIGS. 7 and 9.

Generally, however, a combination of the second set of fingers 604-2 and the fourth set of fingers 604-4 has an odd quantity of fingers per cell 610-2 of multiple cells of the interdigital transducer 126. The width of each cell 610-2 of the multiple cells is based on a targeted wavelength (λ). For example, the width of each cell 610-2 of the multiple cells can be based on a multiple (n) of the targeted wavelength (λ), or (nλ). The illustrated interdigital transducer 126 includes at least one cell 610-2 of the multiple cells with the odd quantity of fingers per cell 138 (e.g., of FIGS. 1 and 3). Here, the at least one cell 610-2 includes fingers 312 having the second spatial property 130-2 and the third spatial property 130-3.

To facilitate a transition with another region 128 (e.g., the first region 128-1), the interdigital transducer 126 can also include at least one partial cell 610-2 (not shown) having fewer fingers than the odd quantity of fingers per cell 138. The partial cell may include two or more fingers corresponding to the second spatial property 130-2 or the third spatial property 130-3. For instance, the second region 128-2 may have a partial cell 610-2 that includes three or four fingers while a “full” cell 610-2 includes five fingers. The partial cell 610-2 can be positioned between a full cell 610-2 with five fingers and a cell 610-1 having two fingers of the first region 128-1. An example of a partial cell is described further below with particular reference to FIGS. 11 and 12.

Figure 7:
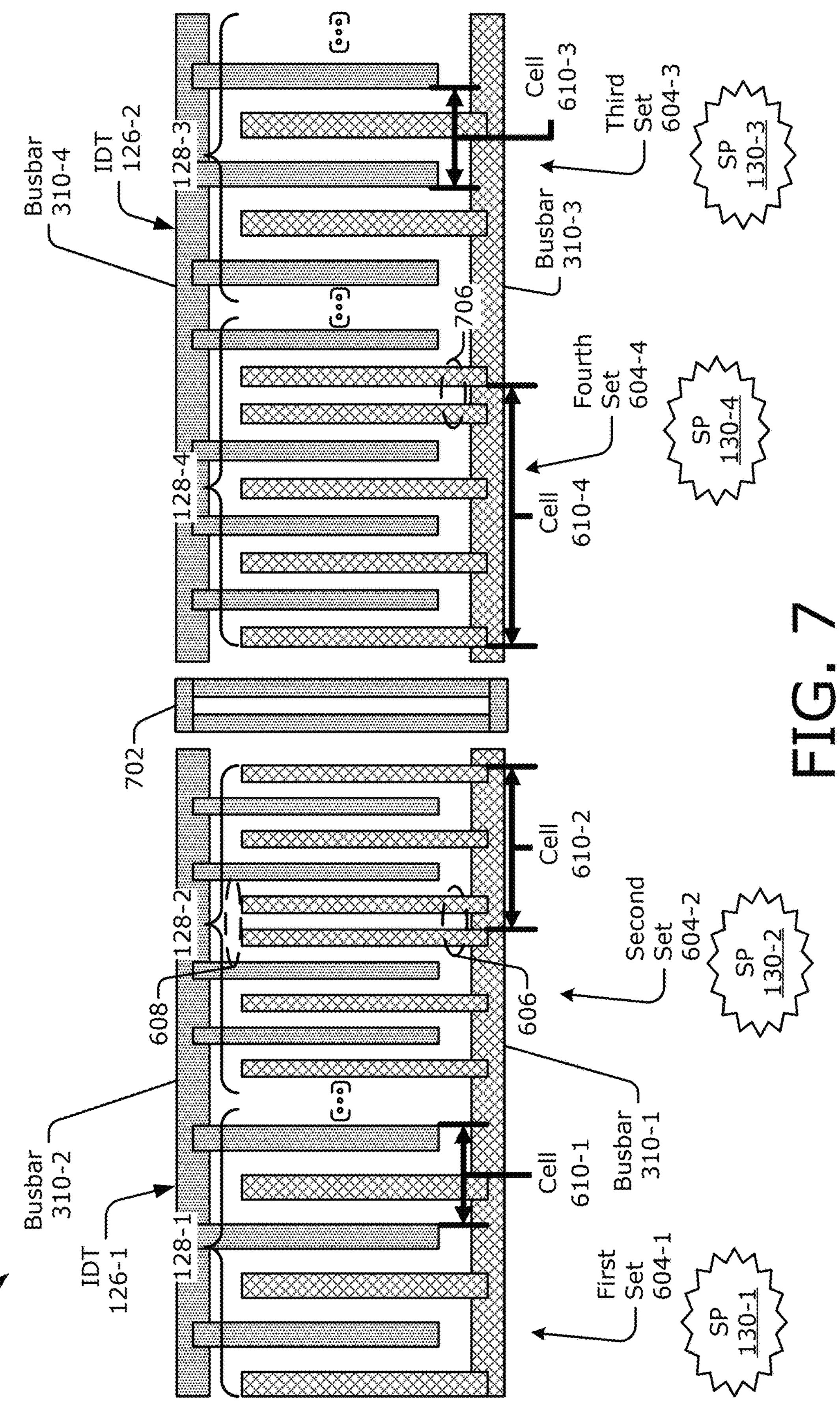
FIG. 7 illustrates an example of two modulated interdigital transducers including multiple regions having sets of fingers, with each interdigital transducer including a region with adjacent fingers.

FIG. 7 illustrates an example of two modulated interdigital transducers 126-1 and 126-2 including multiple regions 128 having sets of fingers, with each interdigital transducer including at least one region having adjacent fingers. The first interdigital transducer 126-1 corresponds to the interdigital transducer 126 depicted in FIG. 6. The portion of a double-mode surface-acoustic-wave filter 124 that is depicted in FIG. 7 also includes part of a second interdigital transducer 126-2 and a grating divider 702 disposed between the two interdigital transducers 126.

In example aspects, the grating divider 702 includes at least two metal strips that are coupled together at opposite ends and that extend across a “height” of the double-mode surface-acoustic-wave filter 124. The two metal strips are substantially parallel to the multiple fingers 312 of the first interdigital transducer 126-1 or the second interdigital transducer 126-2, including being substantially parallel to both in accordance with a permitted, but optional, interpretation of the word “or” as a disjunctive or. As shown, the grating divider 702 can be positioned between the first interdigital transducer 126-1 and the second interdigital transducer 126-2. Although not shown, another grating divider 702 can be positioned between the second interdigital transducer 126-2 and a third interdigital transducer 126-3 (e.g., of FIG.

3 if "N>=3"). Further, a grating divider 702 can instead include one metal strip (e.g., a single metal strip) extending across a "height" (e.g., spanning a space that is approximately between two busbars, potentially also including the busbars) of the double-mode surface-acoustic-wave filter 124. In other words, one metal strip may serve as a shielding structure between adjacent interdigital transducers for phase correction.

In example implementations, the second interdigital transducer 126-2 can include a third busbar 310-3, a fourth busbar 310-4, and multiple other fingers 312. The multiple other fingers 312 (with a cross-hatched pattern) extend from the third busbar 310-3 toward the fourth busbar 310-4. The multiple other fingers 312 include a third set of fingers 604-3 having a third spatial property 130-3. The multiple other fingers 312 also include a fourth set of fingers 604-4 having a fourth spatial property 130-4 different from the third spatial property 130-3. As shown, the fourth spatial property 130-4 includes at least two fingers of the fourth set of fingers 604-4 that are positioned adjacent to each other, as indicated at 706.

The fourth set of fingers 604-4 of the second interdigital transducer 126-2 is physically closer to the second set of fingers 604-2 of the first interdigital transducer 126-1 than is the third set of fingers 604-3 of the second interdigital transducer 126-2. This can occur, for example, by positioning the fourth set of fingers 604-4 between the second set of fingers 604-2 and the third set of fingers 604-3 as shown in FIG. 7.

As illustrated, the second interdigital transducer 126-2 includes two regions: a third region 128-3 and a fourth region 128-4. The third region 128-3 can include multiple cells, like a third cell 610-3. The third spatial property 130-3 of the third set of fingers 604-3 includes an absence of adjacent fingers in the third set of fingers 604-3 and a pitch of the third set of fingers 604-3. In example aspects, the third spatial property 130-3 of the third set of fingers 604-3 can be substantially equivalent to the first spatial property 130-1 of the first set of fingers 604-1. Accordingly, the third cell 610-3 may be substantially equivalent to the first cell 610-1 in terms of the spatial property 130. For example, each of the first and third spatial properties 130-1 and 130-3 can have the same pitch 132, metallization ratio 134, cell width 136, or quantity of fingers per cell 138, in addition to an absence of adjacent fingers.

In contrast, the fourth spatial property 130-4 of the fourth set of fingers 604-4 is illustrated to be different from the second spatial property 130-2 of the second set of fingers 604-2. For example, the second set of fingers 604-2 includes a first quantity of fingers per cell (138, e.g., of FIGS. 1 and 3) of the multiple cells of the second region 128-2 of the first interdigital transducer 126-1. In FIG. 7, there is an example of five fingers per cell (138), as shown in the cell 610-2 of the second region 128-2. The fourth set of fingers 604-4 includes a second quantity of fingers per cell (138) of multiple cells of the fourth region 128-4 of the second interdigital transducer 126-2. In FIG. 7, there is an example of seven fingers per cell (138), as shown in the cell 610-4 of the fourth region 128-4. Thus, the first quantity of fingers per cell is different from (and in this case less than) the second quantity of fingers per cell in the illustrated example. Other differences between the second spatial property 130-2 and the fourth spatial property 130-4 can include pitch 132, metallization ratio 134, or cell width 136.

Figure 8:
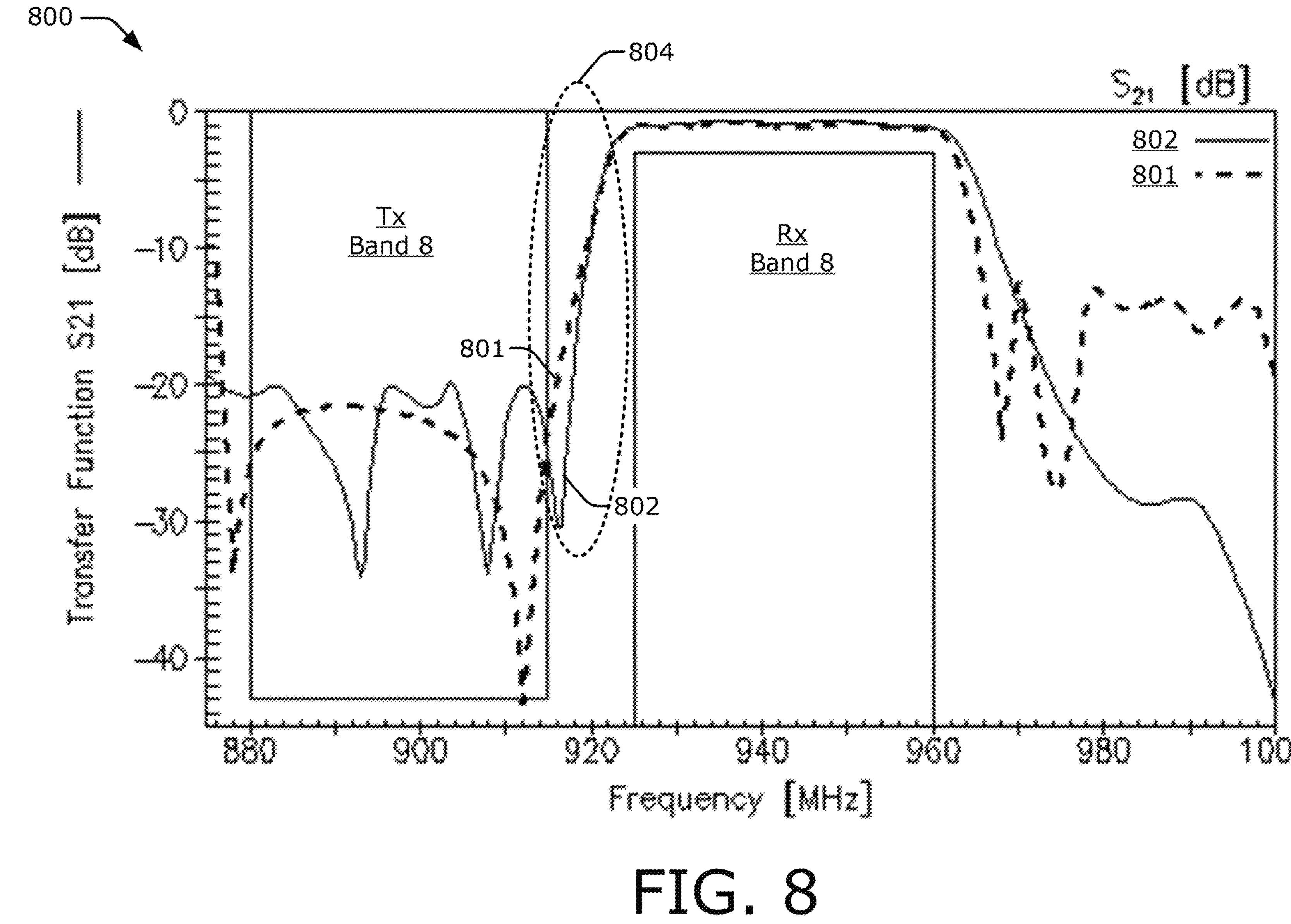
FIG. 8 illustrates an example graph depicting two example transfer functions, one of which can result from implementing aspects of a double-mode surface-acoustic-wave filter having a modulated interdigital transducer.

FIG. 8 illustrates an example graph 800 depicting two example transfer functions. The transfer function 801 depicted by the dashed line represents a double-mode surface-acoustic-wave filter that does not employ the techniques described herein. The transfer function 802 depicted by the solid line, on the other hand, represents a double-mode surface-acoustic-wave filter 124 that does implement aspects of the techniques described herein, such as by having a modulated interdigital transducer 126.

The left skirt region 804 illustrates how a modulated interdigital transducer 126 can steepen the left skirt. The left skirt of the transfer function 802 is steeper than the left skirt of the transfer function 801. This steepening of the left skirt can facilitate operating a wireless transceiver 120 in two proximate bands, such as the receive band 8 (Rx Band 8) and the transmit band 8 (Tx Band 8). By employing the techniques described herein, a left skirt can be made to be steeper, which enables the use of a piezoelectric material having a positive sign of reflection for the electrode, such as lithium niobate (LiNbO3) 122 (LN122), in situations when an adjacent, lower frequency band is close to a given frequency band.

Figure 9:
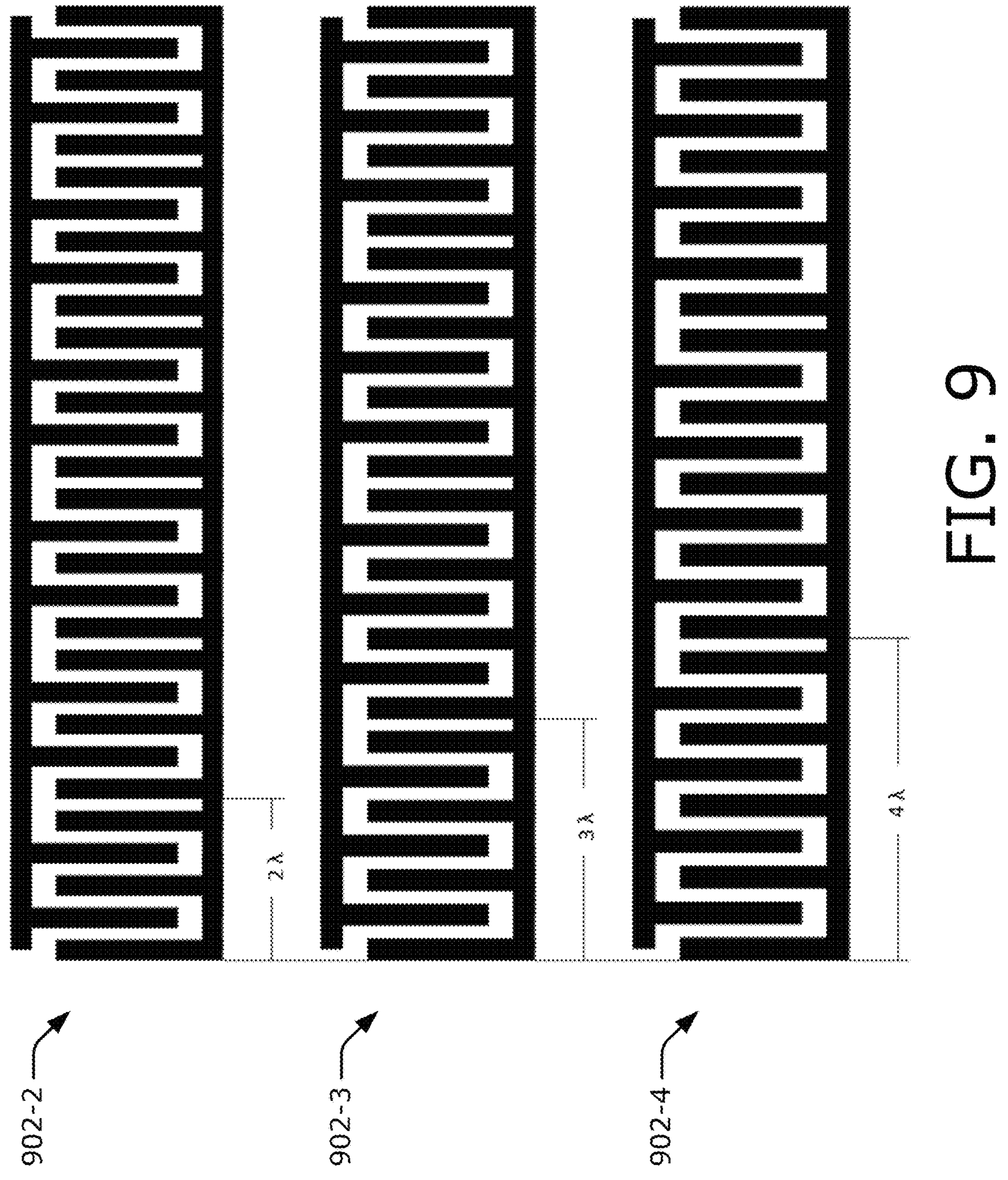
FIG. 9 illustrates three example cell arrangements for modulating an interdigital transducer of a double-mode surface-acoustic-wave filter.

FIG. 9 illustrates three example cell arrangements for modulating an interdigital transducer of a double-mode surface-acoustic-wave filter. Interdigital transducers that are modulated as described herein enable the stopband of an interdigital transducer to be shifted away from the frequency with maximum excitation. In some implementations, interdigital transducers are modulated with cells having a width of nλ and 2n+1 fingers in each cell, with λ corresponding to a wavelength targeted by the filter and n representing a multiple thereof (e.g., n>=1 or n>=2). Within each cell, the fingers may be connected to alternating busbars. At cell boundaries, on the other hand, fingers of a same busbar may be adjacent to each other.

The finger period in such cells is nλ/(2n+1), and the corresponding stopband is consequently shifted towards higher frequencies compared to a "normal" finger cell with a finger period of λ/2. Relatively smaller values for n in this formula result in relatively smaller finger periods compared to larger values for n. Process limits regarding a minimum structure width may impact design considerations. Relatively larger values for n reduce the frequency shift between maximum excitation below the stopband and a boundary of the stopband. A reasonable upper limit for n can therefore result from the stopband width. For instance, the higher the reflectivity per strip, and therefore the higher the width of the stopband, the lower the maximum effective value for n may be.

Each of the depicted interdigital transducers has an example width of 12λ, with the width extending along the path of travel of an acoustic wave along a double-mode surface-acoustic-wave filter. The arrangement of a linear group of such cells results in a finger spatial property 130 in which there are two adjacent fingers from two different cells connected at the same busbar after each cell width of nλ. Examples of such a repetitive cellular arrangement are depicted in FIG. 9. for specific examples where n=2 at 902-2, n=3 at 902-3, and n=4 at 902-4. At the example modulation 902-2, the cell width is 22, and the cell contains five fingers (2×2+1). In each cell, two fingers extend from the "upper" (as depicted in FIG. 9) busbar, and three fingers extend from the "lower" (as depicted in FIG. 9) busbar.

At the example modulation 902-3, the cell width is 32, and the cell contains seven fingers (2×3+1). For each cell, three fingers extend from the "upper" busbar, and four fingers extend from the "lower" busbar. At the example modulation 902-4, the cell width is 42, and the cell contains nine fingers (2×4+1). In each cell, four fingers extend downward from the "upper" busbar, and five fingers extend upward from the "lower" busbar. In each of these example modulations 902, two fingers are adjacent and extend from the same ("lower") busbar. Here, fingers from a same busbar are adjacent at the borders between cells. The other ("upper") busbar accommodates the adjacent fingers by including a gap between two consecutive—but non-adjacent—fingers extending from the upper busbar.

As used herein, adjacent fingers are fingers that have no intervening finger from either busbar, and consecutive fingers are fingers that have no intervening finger from the same busbar. Thus, adjacent fingers are also consecutive fingers, but consecutive fingers are not necessarily adjacent. Adjacent fingers and consecutive fingers can belong to different cells of an interdigital transducer 126. Although multiple example modulations are described with reference to FIG. 9, an interdigital transducer 126 can be modulated with a different value for n, in accordance with a different cellular scheme, or in other manners.

Figure 10:
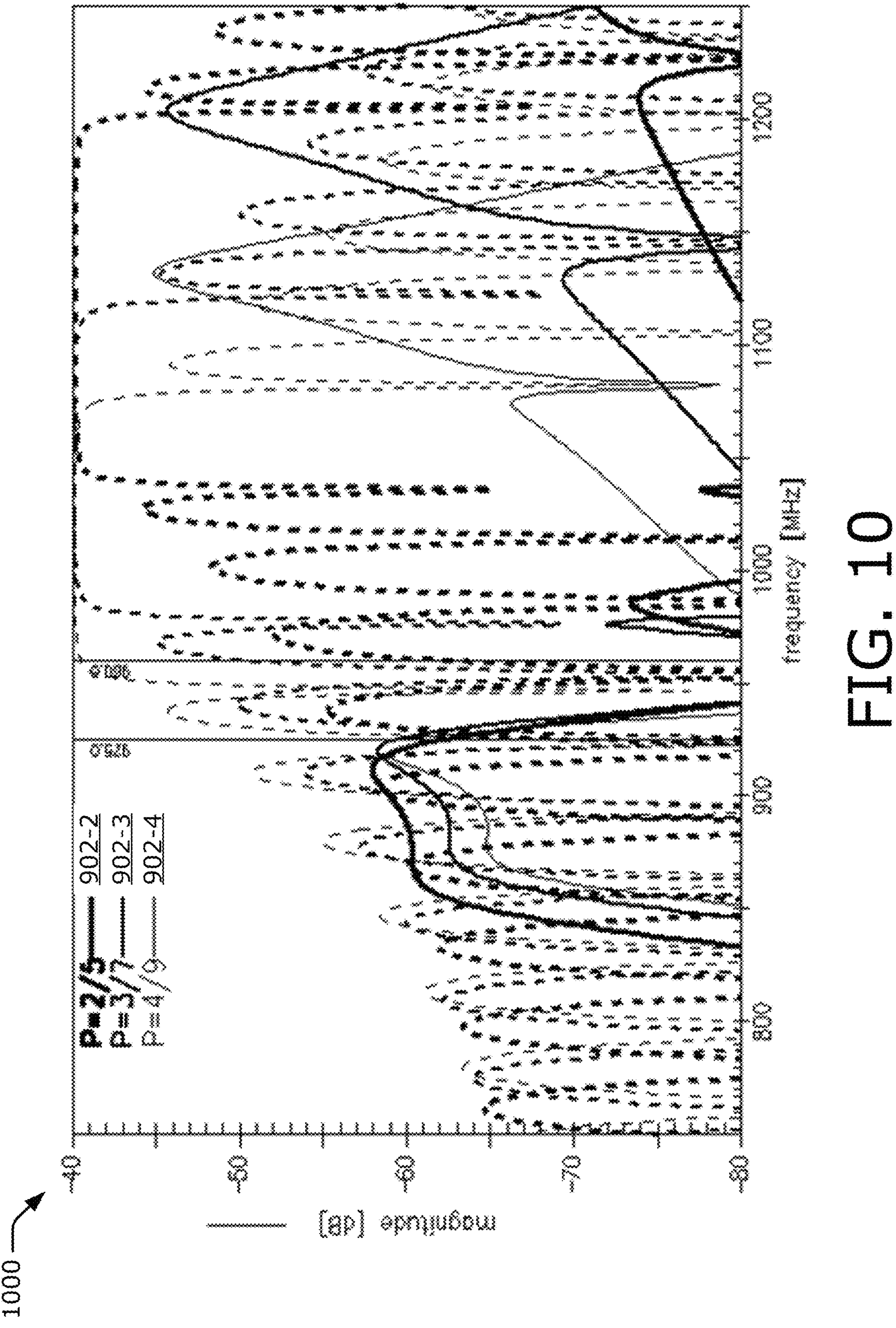
FIG. 10 illustrates an example graph of two aspects of three example modulated interdigital transducers having the three example cell arrangements of FIG. 9.

FIG. 10 illustrates an example graph 1000 of two aspects of the three example modulations 902-2, 902-3, and 902-4 for interdigital transducers having the three example cell arrangements of FIG. 9. The two aspects are the real part of admittance in solid lines and the reflection at the acoustic port in dashed lines. The thickest or darkest lines correspond to the modulation 902-2 having five fingers within two wavelengths. The thinnest or lightest lines correspond to the modulation 902-4 having nine fingers within four wavelengths. The middle-thickness lines correspond to the modulation 902-3 having seven fingers within three wavelengths. As shown in the graph 1000, the acoustic port reflection moves leftward toward lower frequencies as the value of n increases. Further, just below the passband, the admittance generally increases as the value of n increases.

Figure 11:
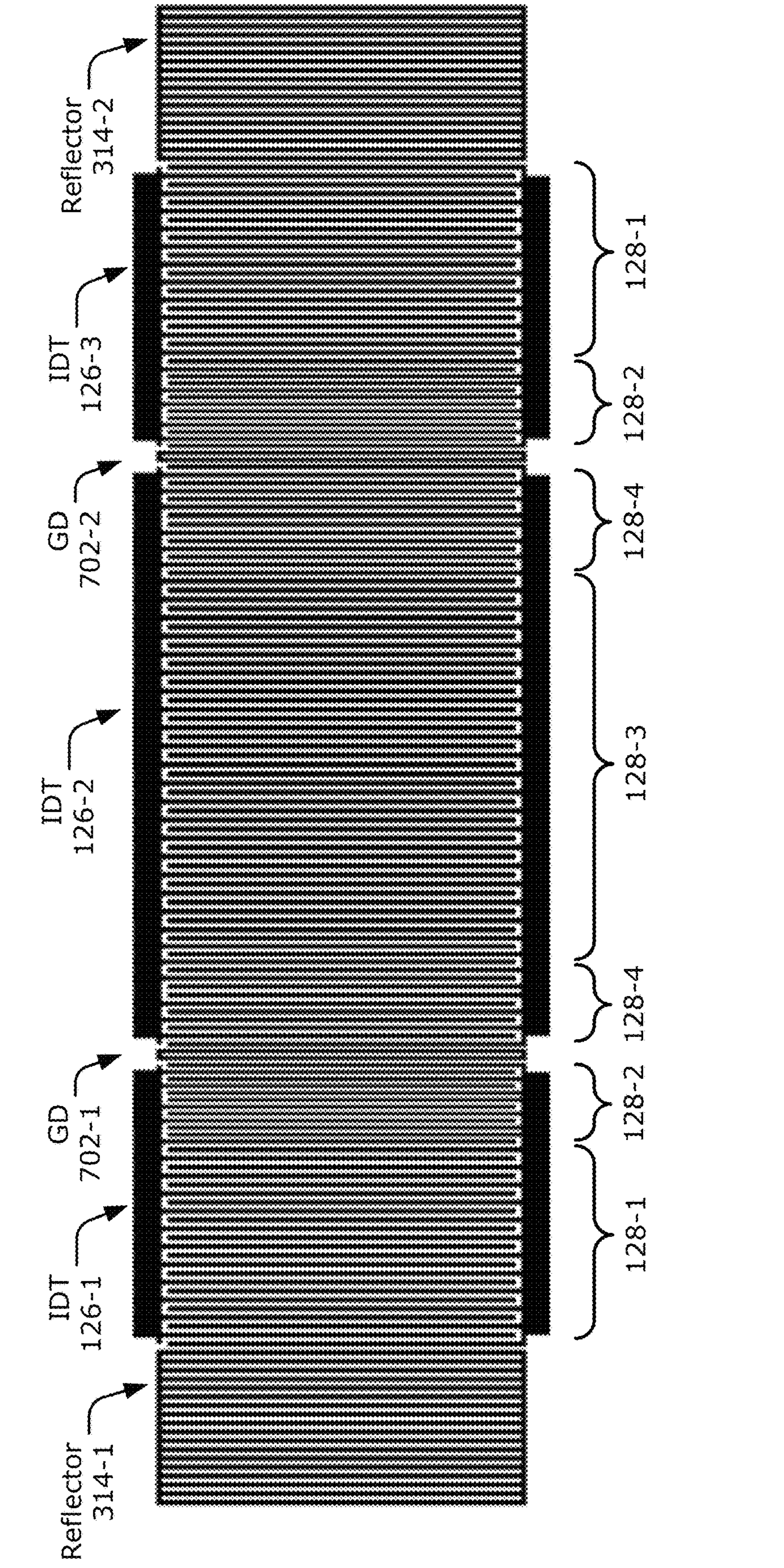
FIG. 11 illustrates an example double-mode surface-acoustic-wave filter including three example modulated interdigital transducers.

FIG. 11 illustrates an example double-mode surface-acoustic-wave filter 124 including three example modulated interdigital transducers. As shown, the double-mode surface-acoustic-wave filter 124 includes, from left-to-right (as depicted in FIG. 11), a first reflector 314-1, a first interdigital transducer 126-1 (IDT 126-1), a first grating divider 702-1 (GD 702-1), a second interdigital transducer 126-2 (IDT 126-2), a second grating divider 702-2 (GD 702-2), a third interdigital transducer 126-3 (IDT 126-3), and a second reflector 314-2. In example implementations, the first interdigital transducer 126-1 includes a first region 128-1 and a second region 128-2, which are also depicted in FIGS. 6 and 7. The second interdigital transducer 126-2 includes a fourth region 128-4 and a third region 128-3, which are depicted in FIG. 7.

In some cases, the double-mode surface-acoustic-wave filter 124 can be symmetrical. In such cases, the second interdigital transducer 126-2 can include another fourth region 128-4 that is substantially similar to the fourth region 128-4 that is proximate to the first interdigital transducer 126-1. Further, the third interdigital transducer 126 can include another second region 128-2 and another first region 128-1. These example interdigital transducers 126 and regions are described next with reference to FIG. 12.

Figure 12:
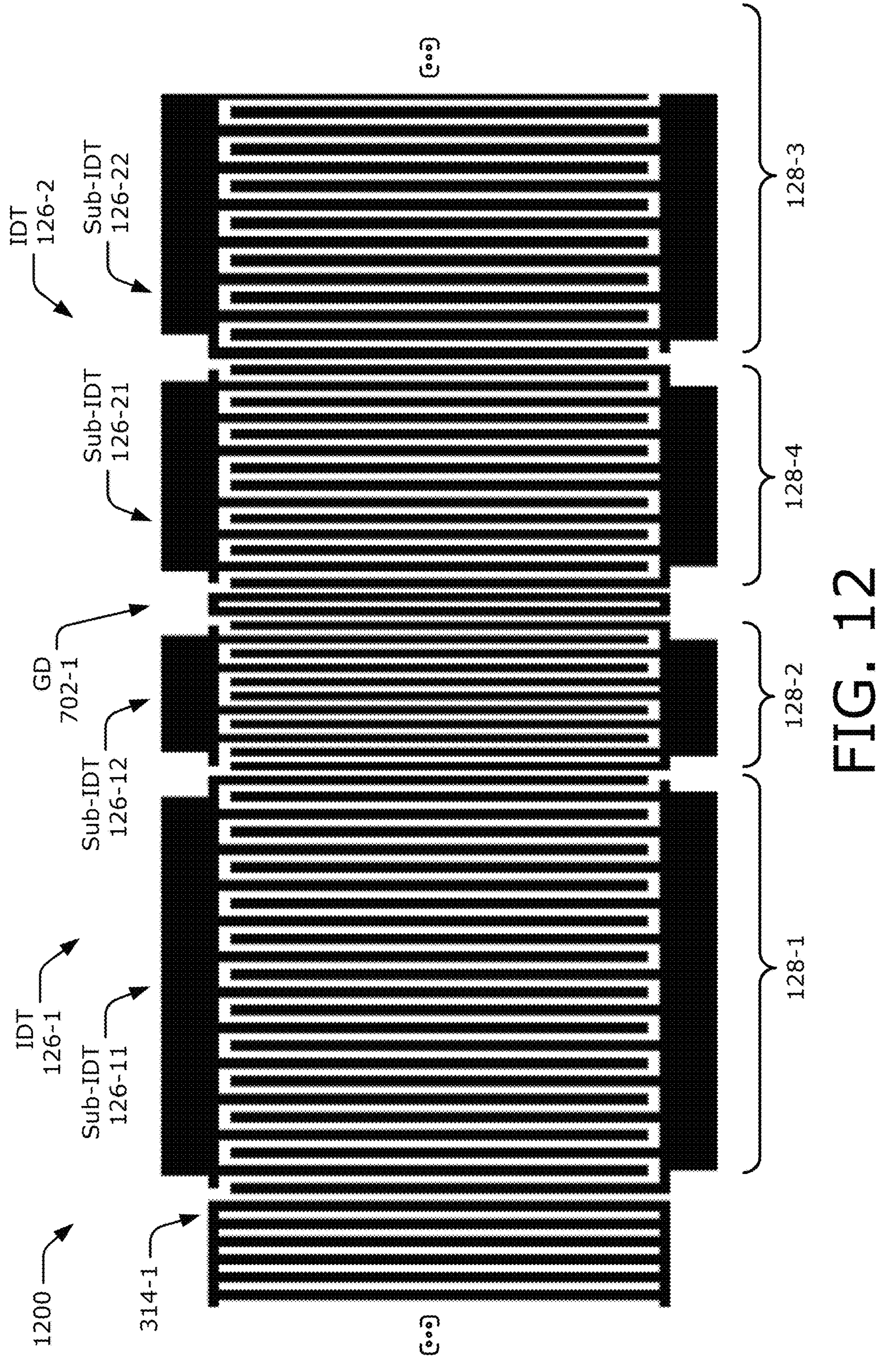
FIG. 12 illustrates an enlarged view of a portion of the example double-mode surface-acoustic-wave filter of FIG. 11 in which each of two interdigital transducers have been separated into two sub-interdigital transducers.

FIG. 12 illustrates an enlarged view of a portion 1200 of the example double-mode surface-acoustic-wave filter 124 of FIG. 11 in which each of two interdigital transducers have been separated into two sub-interdigital transducers. As illustrated, the first interdigital transducer 126-1 includes a first sub-interdigital transducer 126-11 (Sub-IDT 126-11) and a second sub-interdigital transducer 126-12 (Sub-IDT 126-12). The second interdigital transducer 126-2 includes a first sub-interdigital transducer 126-21 (Sub-IDT 126-21) and a second sub-interdigital transducer 126-22 (Sub-IDT 126-22).

In example aspects, the geometry of an example symmetric three-IDT DMS track is shown in FIG. 11. In FIG. 12, a portion of the identical finger structure is depicted in an enlarged format to illustrate more clearly the different parts of the interdigital transducers. The first reflector 314-1 includes 18 metallic strips, six of which are explicitly depicted in FIG. 12. The first sub-interdigital transducer 126-11 includes 12 normally modulated finger cells, each of which includes two fingers distributed across one wavelength. Thus, the first sub-interdigital transducer 126-1 has 24 fingers. The width of the normally modulated finger cell is therefore approximately one wavelength.

The second sub-interdigital transducer 126-12 is positioned between the first sub-interdigital transducer 126-11 and the first grating divider 702-1. The second sub-interdigital transducer 126-12 is a differently modulated portion of the first interdigital transducer 126-1 that includes an odd quantity of fingers per cell. The second sub-interdigital transducer 126-12 has five fingers within two wavelengths per cell (e.g., like the modulation 902-2 of FIG. 9). Three cells of this type form the second sub-interdigital transducer 126-12. However, four fingers of the "left" cell in this second sub-interdigital transducer 126-12 are omitted, which omission forms a partial cell between the two sub-interdigital transducers of the first interdigital transducer 126-1. This partial cell better adapts the phases of the excited waves in the first and second sub-interdigital transducers 126-11 and 126-12 by smoothing the transition in terms of the pitch and metallization ratio (eta). Consequently, in this example, the second sub-interdigital transducer 126-12 includes 11 fingers, instead of 15 fingers.

To connect the first sub-interdigital transducer 126-11 to the second sub-interdigital transducer 126-12, each may be coupled to a common "upper" (as depicted in FIG. 12) busbar and a common "lower" busbar, which common busbar is shown in FIG. 11. As is visually apparent in the enlarged portion 1200 of FIG. 12, the pitch of the second sub-interdigital transducer 126-12 is smaller than the pitch of the first sub-interdigital transducer 126-11.

For phase adaptation between the first interdigital transducer 126-1 and the second interdigital transducer 126-2 with reduced pitch variation, two single finger-like conducting (e.g., metal) strips are disposed in between the two interdigital transducers 126. They are jointly referred to as the first grating divider 702-1. Each grating divider 702 can be connected to ground or can be floating (e.g., by a grounded grating or a floating grating). Each grating divider 702 may include more or fewer than two conductive strips, may be omitted from the double-mode surface-acoustic-wave filter 124, or may have a different quantity of fingers than other grating divider(s).

The geometry of the second interdigital transducer 126-2 is symmetric. On the "left," the first sub-interdigital transducer 126-21 of the second interdigital transducer 126-2 is a modulated portion with cells having a width of three wavelengths and seven fingers per cell (e.g., like the modulation 902-3 of FIG. 9). Two of these cells form the first sub-interdigital transducer 126-21 for a total of 14 fingers. On the "right" side of the second interdigital transducer 126-2, the second sub-interdigital transducer 126-22 includes 39 normally modulated fingers with a cell width of one wavelength and with two fingers per cell. Only a portion of these 39 fingers is shown in FIG. 12. FIG. 11, however, depicts these 39 fingers and another fourth region 128-4, which is adjacent to the second grating divider 702-2, that includes another 14 fingers in the three wavelength and seven finger per-cell modulation 902-3 (of FIG. 9).

As is apparent from the example of FIG. 12, the pitch of the first sub-interdigital transducer 126-21 of the second interdigital transducer 126-2 is greater than the pitch of the second sub-interdigital transducer 126-12 of the first interdigital transducer 126-1 and less than the pitch of the second sub-interdigital transducer 126-22 of the second interdigital transducer 126-2. Further, the pitch of the first sub-interdigital transducer 126-11 of the first interdigital transducer 126-1 can be substantially equivalent to (e.g., be the same as within expected manufacturing variances, such as within 10%, 5%, or even 1% of) the pitch of the second sub-interdigital transducer 126-22 of the second interdigital transducer 126-2. It should be understood that a double-mode surface-acoustic-wave filter 124 can have a different quantity of interdigital transducers 126, a different quantity of fingers, different combinations of modulations of the cells, different pitches, and so forth as compared to the examples shown in FIGS. 11 and 12.

Figure 13:
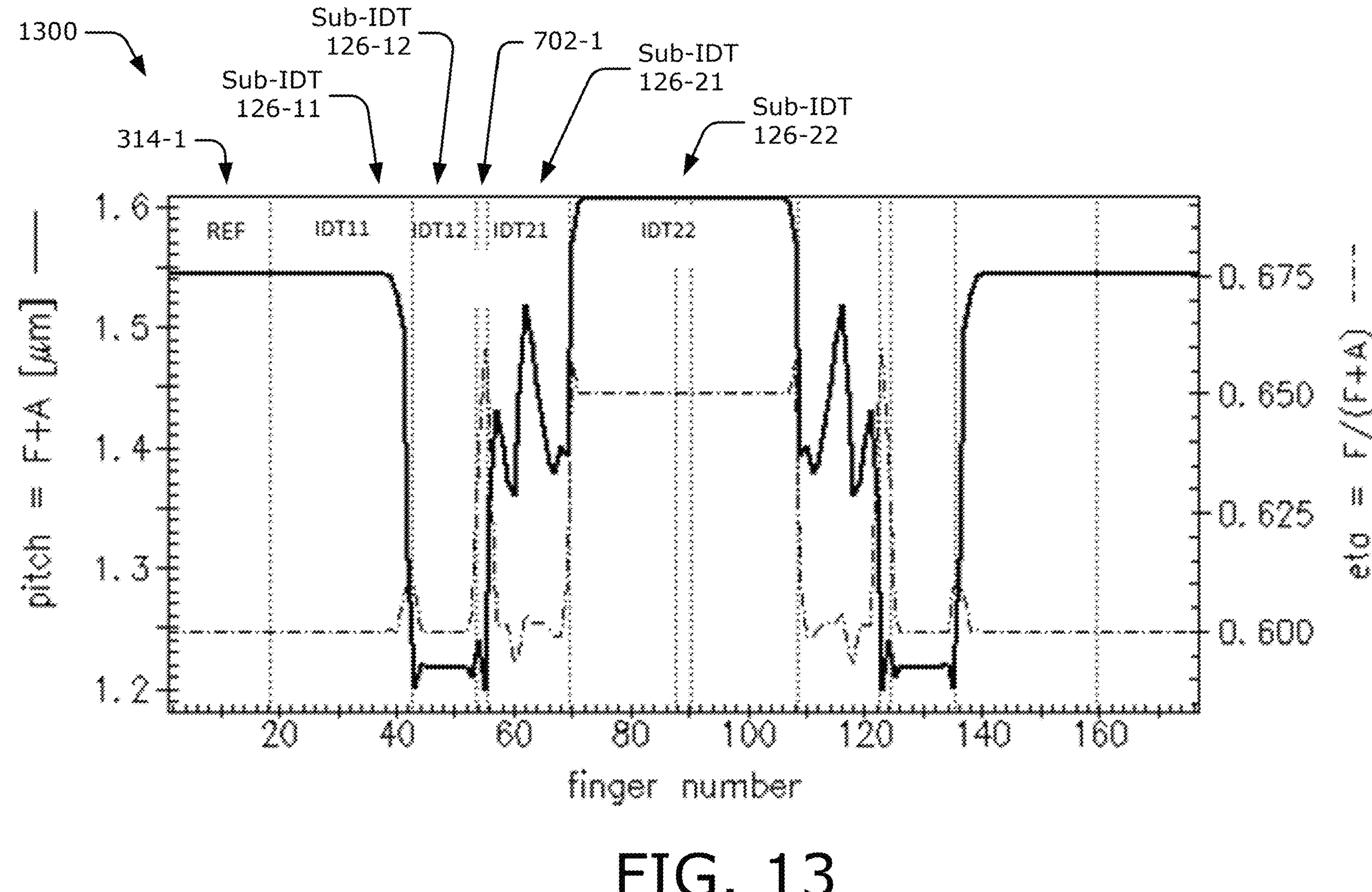
FIG. 13 illustrates an example graph of two aspects of the example double-mode surface-acoustic-wave filter of FIG. 11.

FIG. 13 illustrates an example graph 1300 of two aspects of the example double-mode surface-acoustic-wave filter 124 of FIG. 11. The graph 1300 depicts pitch (on the vertical or y-axis on the left) versus finger number (on the horizontal or x-axis) that is counted along the width of the example double-mode surface-acoustic-wave filter 124. The pitch is shown with a solid line. The graph 1300 also depicts metallization ratio (eta) (on the vertical or y-axis on the right) versus the finger number that is counted along the width of the example double-mode surface-acoustic-wave filter 124. The metallization ratio (eta) is shown with a dashed and dotted line. The depicted finger numbers range from 1 to 176.

As is apparent from the graph 1300, the pitch on the second sub-interdigital transducer 126-12 of the first interdigital transducer 126-1 and the pitch on the first sub-interdigital transducer 126-21 of the second interdigital transducer 126-2 is smaller than the pitch of the normally modulated portions. Because the second sub-interdigital transducer 126-12 has five fingers within two wavelengths as compared to the seven fingers within three wavelengths of the first sub-interdigital transducer 126-21, the mean value of the pitch of the second sub-interdigital transducer 126-12 is smaller than that of the first sub-interdigital transducer 126-21.

Figure 14:
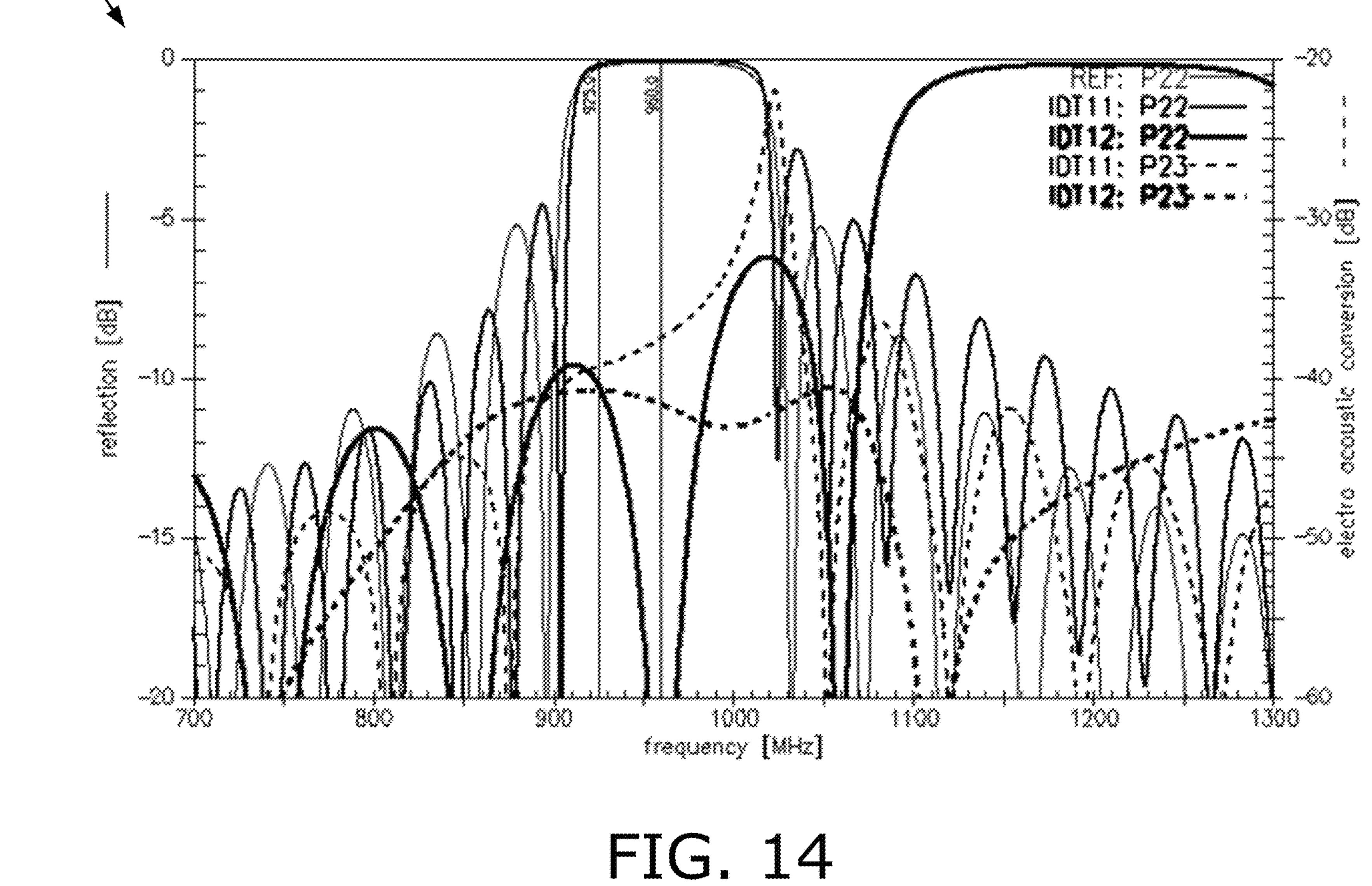
FIG. 14 illustrates an example graph of two aspects of the example first modulated interdigital transducer depicted in FIGS. 11 and 12.
Figure 15:
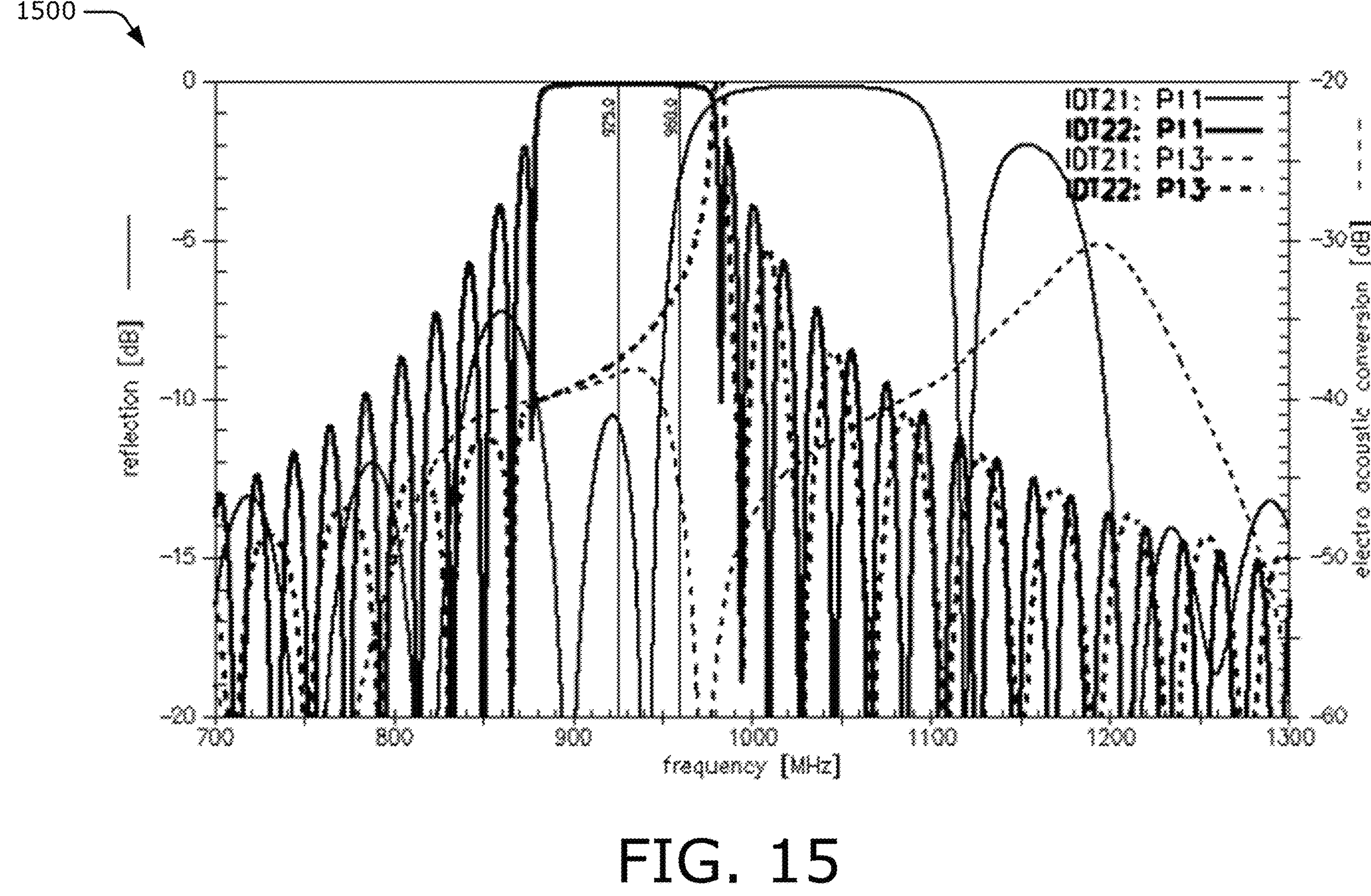
FIG. 15 illustrates an example graph of two aspects of the example second modulated interdigital transducer depicted in FIGS. 11 and 12.

FIG. 14 illustrates an example graph 1400 of two aspects of the example first modulated interdigital transducer 126-1 depicted in FIGS. 11 and 12. FIG. 15 illustrates an example graph 1500 of the same two aspects but of the example second modulated interdigital transducer 126-2 depicted in FIGS. 11 and 12. These graphs 1400 and 1500 depict reflection (on the vertical or y-axis on the left) versus frequency (on the horizontal or x-axis). The reflection is shown with solid lines. These graphs 1400 and 1500 also depict electro acoustic conversion (on the vertical or y-axis on the right) versus frequency. The electro acoustic conversion is shown with dashed lines. The depicted frequency ranges from 700 MHz to 1300 MHz.

Thus, the reflection at the right acoustic port of the reflector and both sub-parts of the respective interdigital transducer 126 are depicted in solid lines. The conversion of the voltage on the common electrical port of both sub-parts of the respective interdigital transducer 126 to the right acoustic port is shown in dashed lines. FIG. 14 corresponds to the first reflector 314-1 ("REF"), the first sub-interdigital transducer 126-11 ("IDT 11") of the first interdigital transducer 126-1, and the second sub-interdigital transducer 126-12 ("IDT 12") of the first interdigital transducer 126-1. FIG. 15 corresponds to the first sub-interdigital transducer 126-21 ("IDT 21") of the second interdigital transducer 126-2 and the second sub-interdigital transducer 126-22 ("IDT 22") of the second interdigital transducer 126-2.

In FIGS. 14 and 15, the shifted stopband of the non-normally modulated parts (e.g., the second sub-interdigital transducer 126-12 and the first sub-interdigital transducer 126-21) of the interdigital transducers 126 compared to that of the normally modulated parts (e.g., the first sub-interdigital transducer 126-11 and the second sub-interdigital transducer 126-22) are visible. The vertical lines at 925 MHz and 960 MHz show the passband of the receive band 8 (Rx band 8). The stopband of the two non-normally modulated sub-interdigital transducers 126 (e.g., the sub-IDT-12 and the sub-IDT-21) is clearly shifted above 925 MHz, but the electro acoustic conversion is close to a local maximum at this frequency.

FIG. 16 is a flow diagram illustrating an example process 1600 for manufacturing a double-mode surface-acoustic-wave filter having a modulated interdigital transducer. The process 1600 is described in the form of a set of blocks 1602 and 1604 that specify operations that can be performed. However, operations are not necessarily limited to the order shown in FIG. 16 or described herein, for the operations may be implemented in alternative orders or in fully or partially overlapping manners. Also, more, fewer, and/or different operations may be implemented to perform the process 1600, or an alternative process. Operations represented by the illustrated blocks of the process 1600 may be performed to manufacture a double-mode surface-acoustic-wave filter 124 (e.g., of FIG. 1-5, 7, or 11). More specifically, the operations of the process 1600 may be performed, at least in part, to manufacture one or more interdigital transducers 126 (e.g., of FIG. 1, 3-7, 9, 11, or 12).

At block 802, a first set of fingers of at least one interdigital transducer of a double-mode surface-acoustic-wave filter is provided, with the first set of fingers extending from a first busbar of the at least one interdigital transducer toward a second busbar of the at least one interdigital transducer, and with the first set of fingers having a first spatial property. For example, a first set of fingers 604-1 of at least one interdigital transducer 126 of a double-mode surface-acoustic-wave filter 124 can be provided. The first set of fingers 604-1 can extend from a first busbar 310-1 of the at least one interdigital transducer 126 toward a second busbar 310-1 of the at least one interdigital transducer 126, and the first set of fingers 604-1 can have a first spatial property 130-1.

For instance, the first set of fingers 604-1 may be disposed adjacent to a reflector 314 and may have a first pitch 132. Further, for the first spatial property 130-1, the first set of fingers 604-1 may have an even quantity of fingers 312 per cell 610-1, such as two fingers per one-wavelength cell or four fingers per one-wavelength cell, or the first set of fingers 604-1 may have an absence of adjacent fingers.

At block 804, a second set of fingers of the at least one interdigital transducer of the double-mode surface-acoustic-wave filter is provided, with the second set of fingers extending from the first busbar toward the second busbar, with the second set of fingers having a second spatial property different from the first spatial property, and with the second spatial property including at least two fingers of the second set of fingers positioned adjacent to each other. For example, a second set of fingers 604-2 of the at least one interdigital transducer 126 of the double-mode surfaceacoustic-wave filter 124 can be provided. The second set of fingers 604-2 can extend from the first busbar 310-1 toward the second busbar 310-2, and the second set of fingers 604-2 can have a second spatial property 130-2 that is different from the first spatial property 130-1. Here, the second spatial property 130-2 can include having at least two fingers 312 of the second set of fingers 604-2 positioned adjacent to each other.

For instance, the second set of fingers 604-2 may be disposed between the first set of fingers 604-1 and another interdigital transducer 126 and may have a second pitch 132 that is different from the first pitch 132 of the first set of fingers 604-1. The respective pitches 132 may be part of the respective spatial properties 130. In some cases, for the second spatial property 130-2, the second set of fingers 604-2 may have an odd quantity of fingers 312 per cell 610-2, such as five fingers per two-wavelength cells or seven fingers per three-wavelength cells, or the second set of fingers 604-2 may have adjacent fingers as indicated at 606.

The following paragraphs describe some aspects of example implementations and/or example configurations related to the apparatuses and/or processes presented above.

Example aspect 1: An apparatus comprising:

a double-mode surface-acoustic-wave filter comprising:

at least one interdigital transducer comprising a first busbar, a second busbar, and multiple fingers extending from the first busbar toward the second busbar, the multiple fingers comprising:

a first set of fingers having a first spatial property; and a second set of fingers having a second spatial property different from the first spatial property, the second spatial property comprising at least two fingers of the second set of fingers positioned adjacent to each other.

Example aspect 2: The apparatus of example aspect 1, wherein:

the first spatial property comprises a first pitch of the first set of fingers; and the second spatial property comprises a second pitch of the second set of fingers, the second pitch different from the first pitch.

Example aspect 3: The apparatus of example aspect 1 or 2, wherein:

the first spatial property comprises a first metallization ratio of the first set of fingers; and the second spatial property comprises a second metallization ratio of the second set of fingers, the second metallization ratio different from the first metallization ratio.

Example aspect 4: The apparatus of any one of the preceding example aspects, wherein the first spatial property of the first set of fingers comprises an absence of adjacent fingers in the first set of fingers.

Example aspect 5: The apparatus of any one of the preceding example aspects, wherein the second set of fingers is positioned adjacent to the first set of fingers along the first busbar of the at least one interdigital transducer.

Example aspect 6: The apparatus of any one of the preceding example aspects, wherein the second set of fingers is associated with an outer edge of the at least one interdigital transducer.

Example aspect 7: The apparatus of any one of the preceding example aspects, wherein:

the at least one interdigital transducer comprises multiple other fingers extending from the second busbar toward the first busbar, the multiple other fingers comprising:

a third set of fingers having the first spatial property; and a fourth set of fingers having a third spatial property, the third spatial property comprising at least two fingers of the fourth set of fingers that are separated by a gap sufficient to permit the at least two fingers of the second set of fingers that are positioned adjacent to each other to be positioned between the at least two fingers of the fourth set of fingers.

Example aspect 8: The apparatus of example aspect 7, wherein the at least two fingers of the fourth set of fingers are nonadjacent to each other but consecutive along the second busbar.

Example aspect 9: The apparatus of example aspect 7, wherein:

a combination of the second set of fingers and the fourth set of fingers has an odd quantity of fingers per cell of multiple cells of the at least one interdigital transducer; and a width of each cell of the multiple cells is based on a targeted wavelength.

Example aspect 10: The apparatus of example aspect 9, wherein the at least one interdigital transducer comprises:

at least one cell of the multiple cells having the odd quantity of fingers per cell, the at least one cell comprising fingers having the second spatial property and the third spatial property; and at least one partial cell of the multiple cells having fewer fingers than the odd quantity of fingers per cell, the at least one partial cell including two or more fingers corresponding to at least one of the second spatial property or the third spatial property.

Example aspect 11: The apparatus of example aspect 9, wherein the width of each cell of the multiple cells is based on a multiple of the targeted wavelength.

Example aspect 12: The apparatus of example aspect 11, wherein:

the odd quantity of fingers per cell comprises five fingers; and the multiple of the targeted wavelength comprises a multiple of two (2).

Example aspect 13: The apparatus of example aspect 12, wherein the odd quantity of fingers per cell comprises:

three fingers of the second set of fingers; and two fingers of the fourth set of fingers.

Example aspect 14: The apparatus of example aspect 11, wherein:

the odd quantity of fingers per cell comprises seven fingers; and the multiple of the targeted wavelength comprises a multiple of three (3).

Example aspect 15: The apparatus of example aspect 14, wherein the odd quantity of fingers per cell comprises:

four fingers of the second set of fingers; and three fingers of the fourth set of fingers.

Example aspect 16: The apparatus of example aspect 11, wherein:

the odd quantity of fingers per cell comprises nine fingers; and the multiple of the targeted wavelength comprises a multiple of four (4).

Example aspect 17: The apparatus of example aspect 16, wherein the odd quantity of fingers per cell comprises:

five fingers of the second set of fingers; and four fingers of the fourth set of fingers.

Example aspect 18: The apparatus of any one of the preceding example aspects, wherein:

the double-mode surface-acoustic-wave filter comprises at least one piezoelectric layer;

the at least one interdigital transducer is disposed on the at least one piezoelectric layer; and the at least one piezoelectric layer comprises a material having a positive sign of reflection for an electrode of the double-mode surface-acoustic-wave filter.

Example aspect 19: The apparatus of example aspect 18, wherein the material having the positive sign of reflection comprises lithium niobate ($LiNbO_3$) 122 (LN122).

Example aspect 20: The apparatus of any one of the preceding example aspects, wherein:

the at least one interdigital transducer comprises a single interdigital transducer; and the single interdigital transducer comprises:

a first sub-interdigital transducer comprising the first set of fingers; and a second sub-interdigital transducer comprising the second set of fingers.

Example aspect 21: The apparatus of any one of the preceding example aspects, wherein:

the at least one interdigital transducer comprises a first interdigital transducer;

the double-mode surface-acoustic-wave filter comprises:

a second interdigital transducer;

a third interdigital transducer;

a first reflector; and a second reflector; and the first interdigital transducer, the second interdigital transducer, and the third interdigital transducer are disposed between the first reflector and the second reflector.

Example aspect 22: The apparatus of example aspect 21, wherein:

the double-mode surface-acoustic-wave filter comprises a grating divider, the grating divider comprising at least one metal strip that extends across the double-mode surface-acoustic-wave filter substantially parallel to the multiple fingers of the first interdigital transducer; and the grating divider is positioned between the first interdigital transducer and the second interdigital transducer.

Example aspect 23: The apparatus of example aspect 21 or 22, wherein:

the second interdigital transducer comprises a third busbar, a fourth busbar, and multiple other fingers extending from the third busbar toward the fourth busbar, the multiple other fingers comprising:

a third set of fingers having a third spatial property; and a fourth set of fingers having a fourth spatial property different from the third spatial property, the fourth spatial property comprising at least two fingers of the fourth set of fingers positioned adjacent to each other.

Example aspect 24: The apparatus of example aspect 23, wherein the fourth set of fingers of the second interdigital transducer is physically closer to the second set of fingers of the first interdigital transducer than is the third set of fingers of the second interdigital transducer.

Example aspect 25: The apparatus of example aspect 23 or 24, wherein:

the third spatial property of the third set of fingers comprises:

an absence of adjacent fingers in the third set of fingers; and a pitch of the third set of fingers; and the third spatial property of the third set of fingers is substantially equivalent to the first spatial property of the first set of fingers.

Example aspect 26: The apparatus of any one of example aspects 23-25, wherein:

the second set of fingers comprises a first quantity of fingers per cell of multiple cells of the first interdigital transducer; and the fourth set of fingers comprises a second quantity of fingers per cell of multiple cells of the second interdigital transducer, the first quantity of fingers per cell different from the second quantity of fingers per cell.

Example aspect 27: The apparatus of any one of the preceding example aspects, further comprising:

a wireless transceiver coupled to at least one antenna, the wireless transceiver comprising the double-mode surface-acoustic-wave filter and configured to filter, using the double-mode surface-acoustic-wave filter, a wireless signal communicated via the at least one antenna.

Example aspect 28: A method of manufacturing a double-mode surface-acoustic-wave filter, the method comprising:

providing a first set of fingers of at least one interdigital transducer of the double-mode surface-acoustic-wave filter, the first set of fingers extending from a first busbar of the at least one interdigital transducer toward a second busbar of the at least one interdigital transducer, the first set of fingers having a first spatial property; and providing a second set of fingers of the at least one interdigital transducer of the double-mode surface-acoustic-wave filter, the second set of fingers extending from the first busbar toward the second busbar, the second set of fingers having a second spatial property different from the first spatial property, the second spatial property comprising at least two fingers of the second set of fingers positioned adjacent to each other.

Example aspect 29: The method of example aspect 28, wherein:

the first spatial property comprises an even quantity of fingers per cell in a first region of the at least one interdigital transducer that comprises the first set of fingers; and the second spatial property comprises an odd quantity of fingers per cell in a second region of the at least one interdigital transducer that comprises the second set of fingers.

Example aspect 30: An apparatus comprising:

a double-mode surface-acoustic-wave filter comprising at least one interdigital transducer, the at least one interdigital transducer comprising:

a first region comprising multiple fingers arranged to alternate fingers from different busbars of the at least one interdigital transducer, the multiple fingers of the first region having a first pitch; and a second region comprising multiple other fingers arranged to include at least two adjacent fingers extending from a same busbar of the at least one interdigital transducer, the multiple other fingers of the second region having a second pitch different from the first pitch.

The terms "first," "second," "third," and other numeric-related indicators are used herein to identify or distinguish similar or analogous items from one another within a given context-such as a particular implementation, a single drawing figure, a given component, or a claim. Thus, a first item in one context may differ from a first item in another context. For example, an item identified as a "first interdigital transducer" in one context may be identified as a "second interdigital transducer" in another context. Similarly, a "first set of fingers" or a "first spatial property" in one claim may be recited as a "second set of fingers" or a "third spatial property," respectively, in a different claim. Additionally, a "third set of fingers" in one claim may be different from (e.g., part of a different interdigital transducer as compared to) a "third set of fingers" in another claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Finally, although subject matter has been described in language specific to structural features or methodological operations, it is to be understood that the subject matter defined in the appended claims is not necessarily limited to the specific features or operations described above. This includes not necessarily being limited to the organizations or combinations in which features are arranged or the orders in which operations are performed. Rather, the specific features and methods are disclosed as example implementations for realizing a double-mode surface-acoustic-wave (SAW) filter having a modulated interdigital transducer.

What is claimed is:

1. An apparatus comprising:

a double-mode surface-acoustic-wave filter comprising:

at least one interdigital transducer comprising a first busbar, a second busbar, and multiple fingers extending from the first busbar toward the second busbar, the multiple fingers comprising:

a first set of fingers having a first spatial property; and a second set of fingers having a second spatial property different from the first spatial property, the second spatial property comprising at least two fingers of the second set of fingers positioned adjacent to each other, the at least one interdigital transducer further comprising multiple other fingers extending from the second busbar toward the first busbar, the multiple other fingers comprising:

a third set of fingers having the first spatial property; and a fourth set of fingers having a third spatial property, the third spatial property comprising at least two fingers of the fourth set of fingers that are separated by a gap sufficient to permit the at least two fingers of the second set of fingers that are positioned adjacent to each other to be positioned between the at least two fingers of the fourth set of fingers.

2. The apparatus of claim 1, wherein:

the first spatial property comprises a first pitch of the first set of fingers; and the second spatial property comprises a second pitch of the second set of fingers, the second pitch different from the first pitch.

3. The apparatus of claim 1, wherein:

the first spatial property comprises a first metallization ratio of the first set of fingers; and the second spatial property comprises a second metallization ratio of the second set of fingers, the second metallization ratio different from the first metallization ratio.

4. The apparatus of claim 1, wherein the first spatial property of the first set of fingers comprises an absence of adjacent fingers in the first set of fingers.

5. The apparatus of claim 1, wherein the second set of fingers is positioned adjacent to the first set of fingers along the first busbar of the at least one interdigital transducer.

6. The apparatus of claim 1, wherein:

the at least one interdigital transducer comprises a single interdigital transducer; and the single interdigital transducer comprises:

a first sub-interdigital transducer comprising the first set of fingers; and a second sub-interdigital transducer comprising the second set of fingers.

7. The apparatus of claim 1, wherein the at least two fingers of the fourth set of fingers are nonadjacent to each other but consecutive along the second busbar.

8. The apparatus of claim 1, wherein:

a combination of the second set of fingers and the fourth set of fingers has an odd quantity of fingers per cell of multiple cells of the at least one interdigital transducer; and a width of each cell of the multiple cells is based on a targeted wavelength.

9. The apparatus of claim 8, wherein the at least one interdigital transducer comprises:

at least one cell of the multiple cells having the odd quantity of fingers per cell, the at least one cell comprising fingers having the second spatial property and the third spatial property; and at least one partial cell of the multiple cells having fewer fingers than the odd quantity of fingers per cell, the at least one partial cell including two or more fingers corresponding to at least one of the second spatial property or the third spatial property.

10. The apparatus of claim 8, wherein the width of each cell of the multiple cells is based on a multiple of the targeted wavelength.

11. The apparatus of claim 1, wherein:

the double-mode surface-acoustic-wave filter comprises at least one piezoelectric layer;

the at least one interdigital transducer is disposed on the at least one piezoelectric layer; and the at least one piezoelectric layer comprises a material having a positive sign of reflection for an electrode of the double-mode surface-acoustic-wave filter.

12. The apparatus of claim 11, wherein the material having the positive sign of reflection comprises lithium niobate ($LiNbO3$).

13. The apparatus of claim 1, wherein:

the at least one interdigital transducer comprises a first interdigital transducer;

the double-mode surface-acoustic-wave filter comprises:

a second interdigital transducer;

a third interdigital transducer;

a first reflector; and a second reflector; and the first interdigital transducer, the second interdigital transducer, and the third interdigital transducer are disposed between the first reflector and the second reflector.

14. The apparatus of claim 13, wherein:

the double-mode surface-acoustic-wave filter comprises a grating divider, the grating divider comprising at least one metal strip that extends across the double-mode surface-acoustic-wave filter substantially parallel to the multiple fingers of the first interdigital transducer; and the grating divider is positioned between the first interdigital transducer and the second interdigital transducer.

15. The apparatus of claim 13, wherein:

the second interdigital transducer comprises a third busbar, a fourth busbar, and multiple other fingers extending from the third busbar toward the fourth busbar, the multiple other fingers of the second interdigital transducer comprising:

a fifth set of fingers having a fourth spatial property; and a sixth set of fingers having a fifth spatial property different from the fourth spatial property, the fifth spatial property comprising at least two fingers of the sixth set of fingers positioned adjacent to each other.

16. The apparatus of claim 15, wherein:

the second set of fingers comprises a first quantity of fingers per cell of multiple cells of the first interdigital transducer; and the sixth set of fingers comprises a second quantity of fingers per cell of multiple cells of the second interdigital transducer, the first quantity of fingers per cell different from the second quantity of fingers per cell.

17. The apparatus of claim 15, wherein:

the fourth spatial property of the fifth set of fingers comprises:

an absence of adjacent fingers in the fifth set of fingers; and a pitch of the fifth set of fingers; and the fourth spatial property of the fifth set of fingers is substantially equivalent to the first spatial property of the first set of fingers.

18. An apparatus comprising:

a double-mode surface-acoustic-wave filter comprising:

at least one interdigital transducer comprising a first busbar, a second busbar, and multiple fingers extending from the first busbar toward the second busbar, the multiple fingers comprising:

a first set of fingers having a first spatial property; and a second set of fingers having a second spatial property different from the first spatial property, the second spatial property comprising at least two fingers of the second set of fingers positioned adjacent to each other, wherein the at least one interdigital transducer comprising a first interdigital transducer, wherein the double-mode surface-acoustic-wave filter further comprises:

a second interdigital transducer;

a third interdigital transducer;

a first reflector; and a second reflector, wherein the first interdigital transducer, the second interdigital transducer, and the third interdigital transducer are disposed between the first reflector and the second reflector, wherein the second interdigital transducer comprises a third busbar, a fourth busbar, and multiple other fingers extending from the third busbar toward the fourth busbar, the multiple other fingers comprising:

a third set of fingers having a third spatial property; and a fourth set of fingers having a fourth spatial property different from the third spatial property, the fourth spatial property comprising at least two fingers of the fourth set of fingers positioned adjacent to each other, and wherein:

the second set of fingers comprises a first quantity of fingers per cell of multiple cells of the first interdigital transducer; and the fourth set of fingers comprises a second quantity of fingers per cell of multiple cells of the second interdigital transducer, the first quantity of fingers per cell different from the second quantity of fingers per cell.

19. A method of manufacturing a double-mode surface-acoustic-wave filter, the method comprising:

providing a first set of fingers of at least one interdigital transducer of the double-mode surface-acoustic-wave filter, the first set of fingers extending from a first busbar of the at least one interdigital transducer toward a second busbar of the at least one interdigital transducer, the first set of fingers having a first spatial property; and providing a second set of fingers of the at least one interdigital transducer of the double-mode surface-acoustic-wave filter, the second set of fingers extending from the first busbar toward the second busbar, the second set of fingers having a second spatial property different from the first spatial property, the second spatial property comprising at least two fingers of the second set of fingers positioned adjacent to each other;

providing a third set of fingers of the at least one interdigital transducer of the double-mode surface-acoustic-wave filter, the third set of fingers extending from the second busbar toward the first busbar, the third set of fingers having the first spatial property; and providing a fourth set of fingers of the at least one interdigital transducer of the double-mode surface-acoustic-wave filter, the fourth set of fingers extending from the second busbar toward the first busbar, the fourth set of fingers having a third spatial property, the third spatial property comprising at least two fingers of the fourth set of fingers that are separated by a gap sufficient to permit the at least two fingers of the second set of fingers that are positioned adjacent to each other to be positioned between the at least two fingers of the fourth set of fingers.

20. An apparatus comprising:

a double-mode surface-acoustic-wave filter comprising at least a first interdigital transducer and a second interdigital transducer, each of the first interdigital transducer and the second interdigital transducer comprising:

a first region comprising multiple fingers arranged to alternate fingers from different busbars, the multiple fingers of the first region having a first pitch; and a second region comprising multiple other fingers arranged to include at least two adjacent fingers extending from a same busbar, the multiple other fingers of the second region having a second pitch that is smaller than the first pitch, wherein the second region of the first interdigital transducer is adjacent to the second region of the second interdigital transducer.

* * * * *